United States Patent
Fujiwara

(10) Patent No.: US 11,557,056 B2
(45) Date of Patent: Jan. 17, 2023

(54) IMAGE-CAPTURING CONTROL APPARATUS, IMAGE-CAPTURING CONTROL METHOD, AND STORAGE MEDIUM FOR EVALUATING APPEARANCE OF OBJECT

(71) Applicant: CANON KABUSHIKI KAISHA, Tokyo (JP)

(72) Inventor: Chika Fujiwara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/108,323

(22) Filed: Dec. 1, 2020

(65) Prior Publication Data

US 2021/0174541 A1 Jun. 10, 2021

(30) Foreign Application Priority Data

Dec. 6, 2019 (JP) .............................. JP2019-221183
Jul. 31, 2020 (JP) .............................. JP2020-129853

(51) Int. Cl.
*G06T 7/90* (2017.01)
*H04N 5/232* (2006.01)
(Continued)

(52) U.S. Cl.
CPC ................. *G06T 7/74* (2017.01); *G06T 7/60* (2013.01); *G06T 7/90* (2017.01); *G11B 19/025* (2013.01);
(Continued)

(58) Field of Classification Search
CPC ...... G06T 7/74; G06T 7/90; G06T 7/60; G06T 2207/30204; H04N 5/23222
See application file for complete search history.

(56) References Cited

U.S. PATENT DOCUMENTS 5,852,675 A * 12/1998 Matsuo ................ H04N 1/6033
382/167
5,864,364 A * 1/1999 Ohyama ............... H04N 1/6088
348/370
(Continued)

FOREIGN PATENT DOCUMENTS

JP 2004004554 A1 * 1/2004
JP 2015046142 A 3/2015
(Continued)

*Primary Examiner* — Michael Robert Cammarata
(74) *Attorney, Agent, or Firm* — Carter, DeLuca & Farrell LLP

(57) ABSTRACT

An image-capturing control apparatus controls an image capturing unit, which is configured to capture an image of a reference object serving as an evaluation reference, to obtain color information to be used for appearance evaluation of a target object. The image-capturing control apparatus includes a first obtaining unit configured to obtain data on a face orientation of an evaluation area on the target object and a second obtaining unit configured to, based on the data on the face orientation, control the image capturing unit such that the image capturing unit captures images of the reference object until the difference between the face orientation of the evaluation area and a face orientation of the reference object becomes smaller than a threshold value and obtain color information on the reference object for a case where the difference is smaller than the threshold value.

12 Claims, 28 Drawing Sheets

(51) Int. Cl.
 *G06T 7/60* (2017.01)
 *G06T 7/73* (2017.01)
 *G11B 19/02* (2006.01)
 *G06F 30/10* (2020.01)

(52) U.S. Cl.
 CPC ... *H04N 5/23222* (2013.01); *H04N 5/232933* (2018.08); *G06F 30/10* (2020.01); *G06T 2207/30204* (2013.01)

(56) References Cited

U.S. PATENT DOCUMENTS

| | | | | |
|---|---|---|---|---|
| 8,059,183 | B2 * | 11/2011 | Seto | H04N 1/6033 348/346 |
| 8,872,923 | B2 * | 10/2014 | Gottwals | H04N 17/002 348/176 |
| 9,787,965 | B2 * | 10/2017 | Tozuka | H04N 13/257 |
| 10,032,266 | B1 * | 7/2018 | Madey | G01J 3/0202 |
| 10,362,984 | B2 * | 7/2019 | Adi | G06T 7/0016 |
| 11,024,065 | B1 * | 6/2021 | Baron | G06T 19/006 |
| 2006/0001739 | A1 * | 1/2006 | Babayoff | G01J 3/508 348/E13.005 |
| 2007/0064119 | A1 * | 3/2007 | Komiya | H04N 9/0455 348/222.1 |
| 2009/0167762 | A1 * | 7/2009 | Alon | G06T 15/50 345/426 |
| 2011/0032380 | A1 * | 2/2011 | Ishida | H04N 1/6033 348/E9.051 |
| 2014/0232879 | A1 * | 8/2014 | Gottwals | H04N 17/002 348/188 |
| 2015/0245009 | A1 * | 8/2015 | Tozuka | G01J 3/524 433/29 |
| 2017/0318178 | A1 * | 11/2017 | Debevec | G08B 13/19634 |
| 2020/0082572 | A1 * | 3/2020 | Beeler | G06T 15/506 |
| 2021/0410347 | P1 * | 12/2021 | Davasse | |

FOREIGN PATENT DOCUMENTS

| | | | | |
|---|---|---|---|---|
| WO | WO-2005117452 A1 * | 12/2005 | | G01J 3/508 |
| WO | WO-2021096520 A1 * | 5/2021 | | |

* cited by examiner

| POLYGON NO | VERTEX 1 | | | VERTEX 2 | | | VERTEX 3 | | |
|---|---|---|---|---|---|---|---|---|---|
| | X | Y | Z | X | Y | Z | X | Y | Z |
| 1 | # | # | # | # | # | # | # | # | # |
| 2 | # | # | # | # | # | # | # | # | # |
| 3 | # | # | # | # | # | # | # | # | # |
| ⋮ | ⋮ | ⋮ | ⋮ | ⋮ | ⋮ | ⋮ | ⋮ | ⋮ | ⋮ |
| # | # | # | # | # | # | # | # | # | # |

IMAGE-CAPTURING CONTROL APPARATUS, IMAGE-CAPTURING CONTROL METHOD, AND STORAGE MEDIUM FOR EVALUATING APPEARANCE OF OBJECT

BACKGROUND OF THE INVENTION

Field of the Invention

The present invention relates to a technique for evaluating the appearance of an object.

Description of the Related Art

As for evaluation of the appearance of an object, techniques have been known for performing evaluation with conditions such as the shape of the object and the lighting angle in image-capturing taken into account. Japanese Patent Laid-Open No. 2015-046142 discloses a technique of: generating multiple profiles in which reference-color three-dimensional objects are associated with lighting conditions in image-capturing; and performing color conversion on a captured image of a subject by using a profile selected out of the multiple profiles.

In Japanese Patent Laid-Open No. 2015-046142, images of the reference objects are captured for each of multiple geometric conditions, and multiple profiles for color conversion are generated based on the captured images obtained from the image-capturing. Accordingly, the technique has a problem in that it is costly to perform image-capturing and processing on the captured images for color evaluation of an object.

SUMMARY OF THE INVENTION

To achieve the above objective, an aspect of the present invention is an image-capturing control apparatus that controls an image capturing unit configured to capture an image of a reference object serving as an evaluation reference, to obtain color information to be used for appearance evaluation of a target object, the image-capturing control apparatus including: a first obtaining unit configured to obtain data on a face orientation of an evaluation area on the target object; a second obtaining unit configured to, based on the data on the face orientation, control the image capturing unit such that the image capturing unit captures images of the reference object until the difference between the face orientation of the evaluation area and a face orientation of the reference object becomes smaller than a threshold value and obtain color information on the reference object for a case where the difference is smaller than the threshold value; and an output unit configured to output the color information on the reference object to an evaluation unit configured to evaluate an appearance of the target object.

Further features of the present invention will become apparent from the following description of exemplary embodiments with reference to the attached drawings.

DESCRIPTION OF THE EMBODIMENTS

The following describes embodiments of the present invention in detail with reference to the drawings. Note that the following embodiments are not intended to limit the present invention. In addition, the combinations of all the features described in the present embodiments are not necessarily indispensable to solve the problems dealt with by the present invention.

First Embodiment

In a first embodiment, a captured image of a reference plate is obtained in the case where the difference between the face orientation of a target object and the face orientation of the reference plate obtained in the same image-capturing conditions as when the image of the target object is captured (such as lighting and the positional relationship between the image capturing apparatus and the target object) becomes smaller than a threshold value. Then, color evaluation is performed on the target object based on the obtained captured image. Note that the color evaluation provided by the present embodiment is used, for example, for calibration of an image capturing apparatus or adjustment of the color of a target object for image capturing.

<Configuration of Color Evaluation System>

Figure 1A:
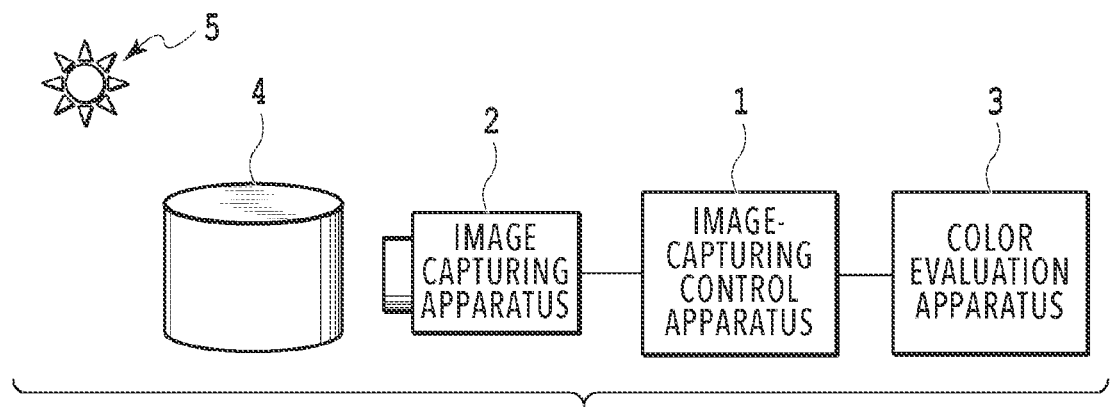
FIG. 1A is a diagram illustrating the configuration of a color evaluation system.

FIG. 1A is a diagram illustrating the configuration of a color evaluation system according to the first embodiment. The color evaluation system of the present embodiment includes an image-capturing control apparatus 1, an image capturing apparatus 2, and a color evaluation apparatus 3.

The image capturing apparatus 2 includes a lens and an area sensor composed of a CMOS or the like and generates image data having 24-bit color values for each pixel, 8 bits for R (red), 8 bits for G (green), and 8 bits for B (blue), based on a captured image. Note that the image capturing apparatus 2 may be any camera that is capable of obtaining a two-dimensional distribution of color information on a target object for image capturing, and thus, the number of colors, the bit depth, the number of pixels, and the like are not limited to the foregoing configuration. A light source 5 irradiates an object 4 with light.

Figure 1B:
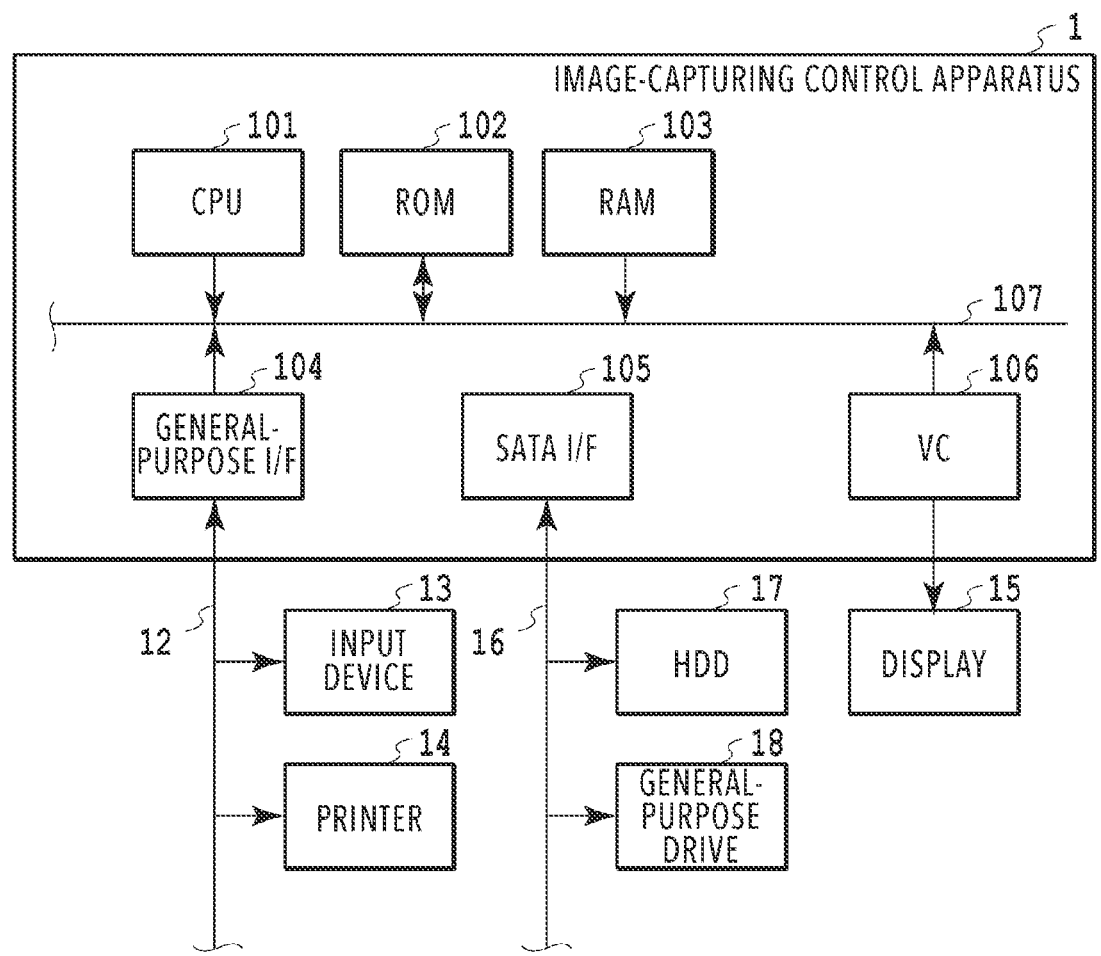
FIG. 1B is a diagram illustrating the configuration of the color evaluation system.

FIG. 1B is a block diagram illustrating the hardware configuration of the image-capturing control apparatus 1. The image-capturing control apparatus 1 is, for example, a computer that includes a CPU 101, ROM 102, RAM 103, a general-purpose interface (I/F) 104, a serial ATA (SATA) I/F 105, and a video card (VC) 106. The CPU 101 executes an operating system (OS) and various programs stored in the ROM 102, a hard disk drive (HDD) 17, and the like, using the RAM 103 as work memory. The CPU 101 also controls each constituent via a system bus 107. Note that the processes illustrated in the flowcharts described later with reference to FIG. 3 and other figures are executed by program codes, stored in the ROM 102, the HDD 17, or the like, being loaded into the RAM 103 and executed by the CPU 101. The general-purpose IF 104 is connected via a serial bus 12 to an input device 13 including as a mouth and a keyboard and a printer 14. The SATA I/F 105 is connected via a serial bus 16 to the HDD 17 and a general-purpose drive 18 configured to perform read and write on various recording media. The CPU 101 uses the HDD 17 and various recording media set in the general-purpose drive 18 as storage locations for various kinds of data. The VC 106 is connected to a display 15. The CPU 101 displays UIs (user interfaces) provided by programs on the display 15 (in other words, the CPU 101 performs display control) and receives input information indicating instructions from the user obtained via the input device 13.

The color evaluation apparatus 3 has a configuration the same as or similar to that of the image-capturing control apparatus 1 and includes a CPU, RAM, ROM, a general-purpose I/F, a SATA I/F, and a video card.

Note that the image-capturing control apparatus 1 and the color evaluation apparatus 3 described above may be integrated into one apparatus, and that such an apparatus may serve as a color evaluation system or a color evaluation apparatus.

<Functional Configuration of Color Evaluation System>

Figure 2:
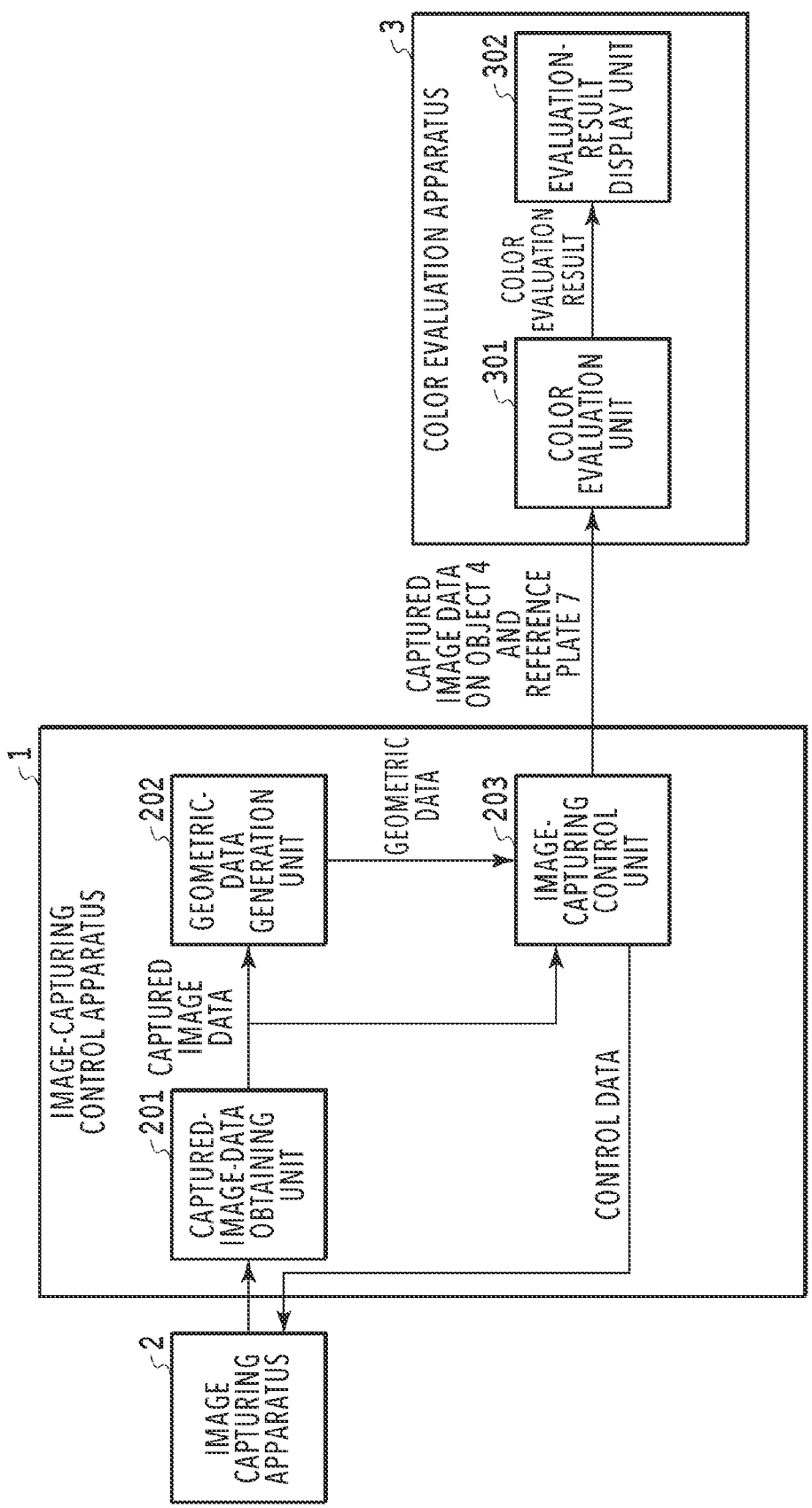
FIG. 2 is a block diagram illustrating the functional configuration of the color evaluation system.

FIG. 2 is a block diagram mainly illustrating functional elements included in the color evaluation system according to the first embodiment. The color evaluation system of the present embodiment includes the image-capturing control apparatus 1 and the color evaluation apparatus 3 described above with reference to FIG. 1A. The functional elements of the image-capturing control apparatus 1 are a captured-image-data obtaining unit 201, a geometric-data generation unit 202, and an image-capturing control unit 203, and the functional elements of the color evaluation apparatus 3 are a color evaluation unit 301 and an evaluation-result display unit 302.

The captured-image-data obtaining unit 201 obtains captured image data on the object 4, which is the target of color evaluation, captured by the image capturing apparatus 2. The geometric-data generation unit 202 calculates geometric data representing the three-dimensional shape of the object 4 based on the captured image data on the object 4 obtained by the captured-image-data obtaining unit 201. The image-capturing control unit 203 controls the image capturing apparatus 2 based on the geometric data calculated by the geometric-data generation unit 202, so that the image capturing apparatus 2 captures an image of a reference object, and thereby the image-capturing control unit 203 obtains captured image data on the reference object via the captured-image-data obtaining unit 201. The reference object in the present embodiment is a reference plate made of the same material as the object 4.

The color evaluation unit 301 evaluates the color of a surface of the object 4 based on the captured image data on the object 4 captured by the image capturing apparatus 2 and the captured image data on the reference object obtained by the image-capturing control unit 203 controlling the image capturing apparatus 2. The evaluation-result display unit 302 displays the results of the color evaluation performed by the color evaluation unit 301 on the display 15. In other words, the evaluation-result display unit 302 performs display control on the evaluation results.

<Process in Color Evaluation System>

Figure 3:
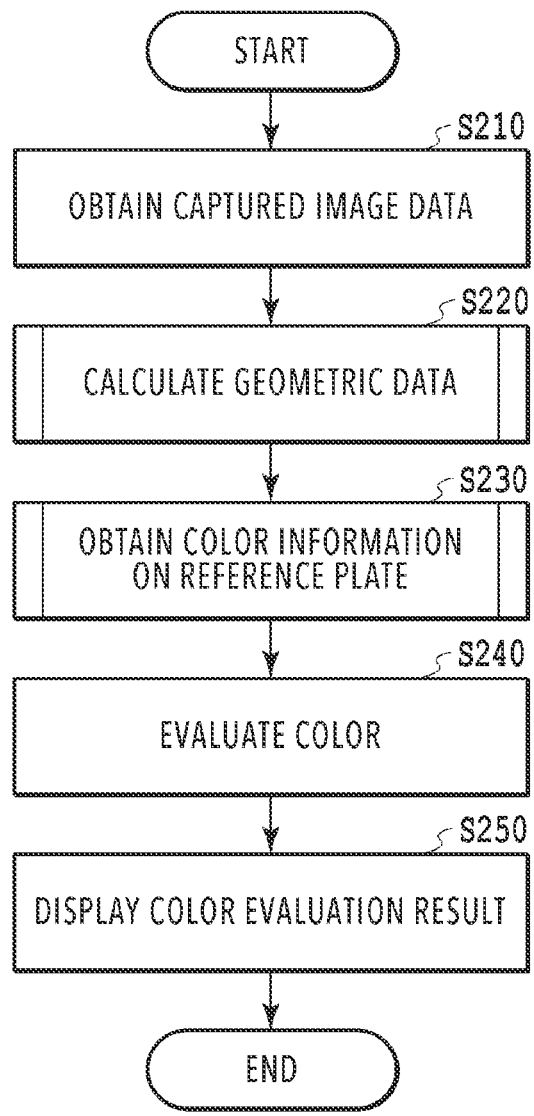
FIG. 3 is a flowchart illustrating a process in the color evaluation system.

FIG. 3 is a flowchart illustrating a process executed in the color evaluation system according to the first embodiment. Hereinafter, each step (process) is indicated by a letter "S" in front of each reference numeral, and thus, the word "step" is omitted. The same is true of other flowcharts.

First, at S210, the captured-image-data obtaining unit 201 obtains captured image data obtained by the image capturing apparatus 2 capturing an image of the object 4. Then, at S220, the geometric-data generation unit 202 generates geometric data representing the three-dimensional shape of the object 4 based on the captured image data obtained by the captured-image-data obtaining unit 201. Details of the process in this S220 will be described later with reference to FIGS. 4, 5A, and 5B and parts (a) and (b) of FIG. 6.

Next, at S230 the image-capturing control unit 203 obtains color information on the reference object. Specifically, the image-capturing control unit 203 controls the image capturing apparatus 2 to capture an image of the reference object and obtains geometric data on the reference object generated by the geometric-data generation unit 202 from the captured image data obtained from the image capturing. Then, based on the geometric data on the object 4 and the reference object, the image-capturing control unit 203 makes the image capturing apparatus 2 capture images of the reference object until the difference between the face orientation of the position (evaluation area) on the object 4 at which color evaluation is to be performed and the face orientation of the reference plate becomes smaller than a threshold value. In the case where the difference between the face orientations becomes smaller than the threshold, the image-capturing control unit 203 makes the image capturing apparatus 2 stop capturing images and obtains captured image data (color information) on the reference object for the case where the difference between the face orientations is smaller than the threshold value. In this image capturing, the image is captured in the same image-capturing conditions as when captured image data was obtained at S210. Details of the process in S230 will be described later with reference to FIGS. 7, 8, and 9.

Then, at S240, the color evaluation unit 301 evaluates the color of the surface of the object 4 based on the captured image data on the object 4 and the captured image data on the reference object obtained by the image-capturing control unit 203. In this evaluation, the color difference between both pieces of data and other characteristics are determined as evaluation values as details of this process will be described later.

Lastly, at S250, the evaluation-result display unit 302 displays the results of the color evaluation performed by the color evaluation unit 301 on the display 15.

<Process in S220: Generation of Geometric Data>

Figure 4:
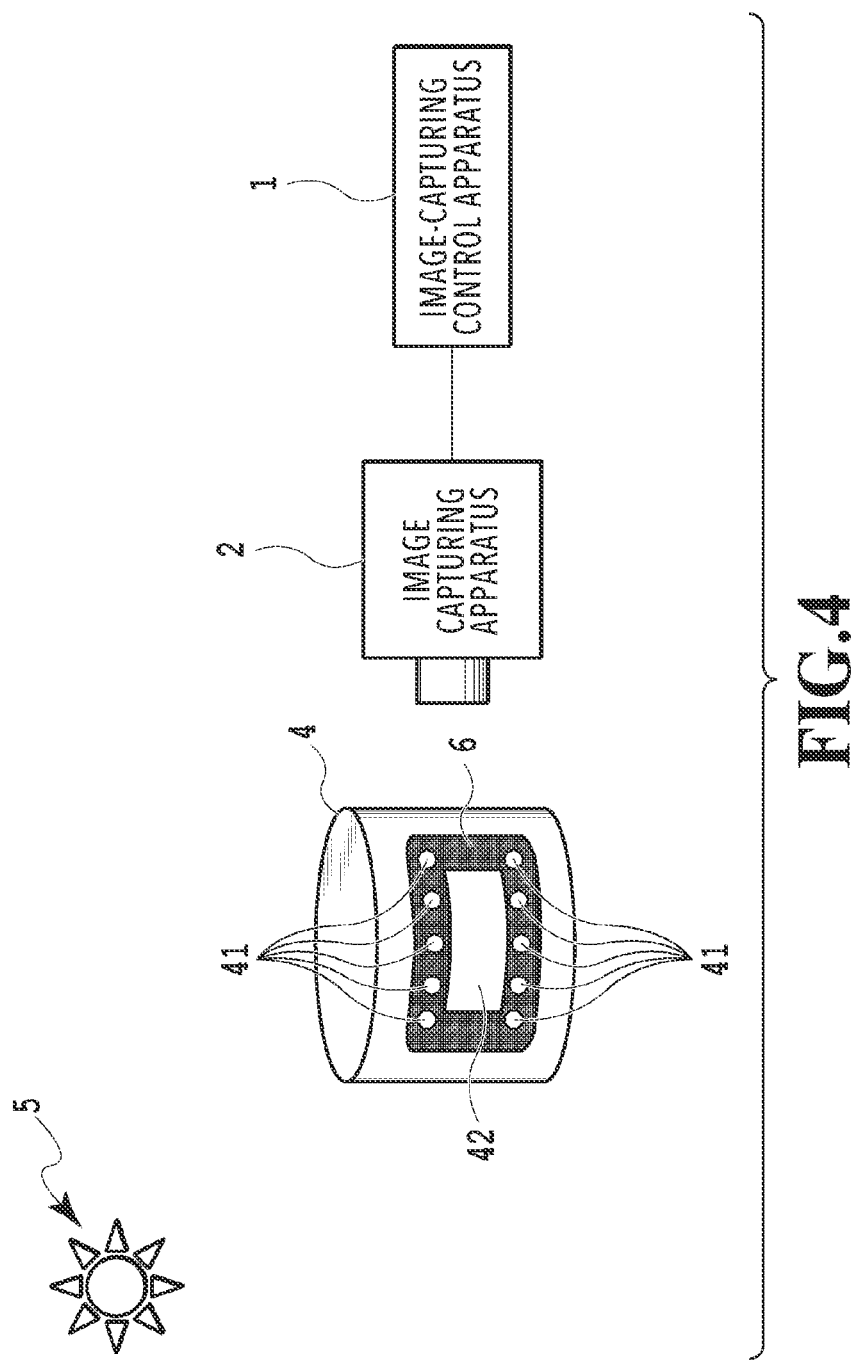
FIG. 4 is a diagram for explaining a method of calculating the three-dimensional shape of an object.

This process generates the geometric data representing the three-dimensional shape of the object 4. FIG. 4 is a diagram for explaining a method of calculating the three-dimensional shape of the object 4, according to the first embodiment. As illustrated in FIG. 4, the object 4 which is the target of the color evaluation has a marker 6 attached on it. The marker 6 has pattern areas 41 and an evaluation area 42. The evaluation area 42 is an area where part of the marker 6 is cut off. Thus, in the case where the marker 6 is attached on the object 4, part of the surface of the object 4 is exposed through the evaluation area 42. This area can be used for the color evaluation on the surface of the object 4. At S220, the captured image data obtained by capturing an image of the object 4 with the marker 6 attached is used to calculate the three-dimensional shape of the object 4.

Figure 5A:
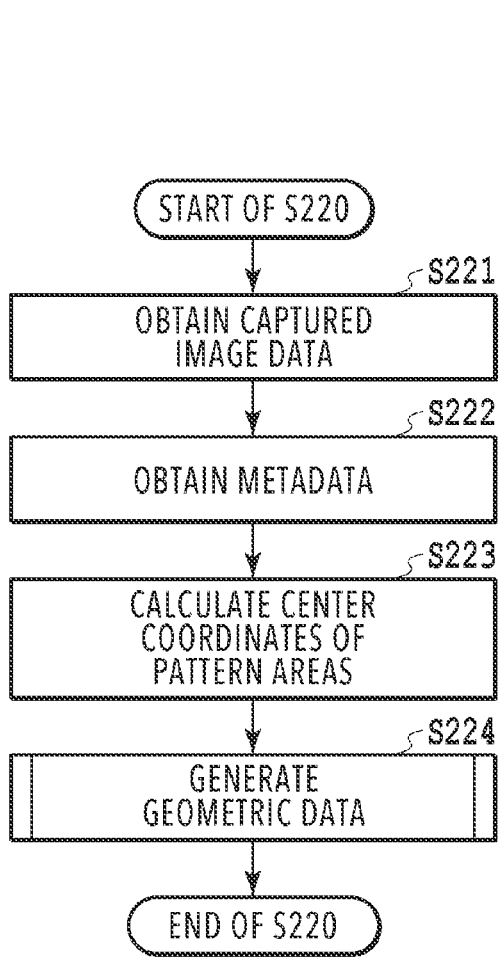
FIG. 5A is a flowchart illustrating a process of generating geometric data on an object.
Figure 5B:
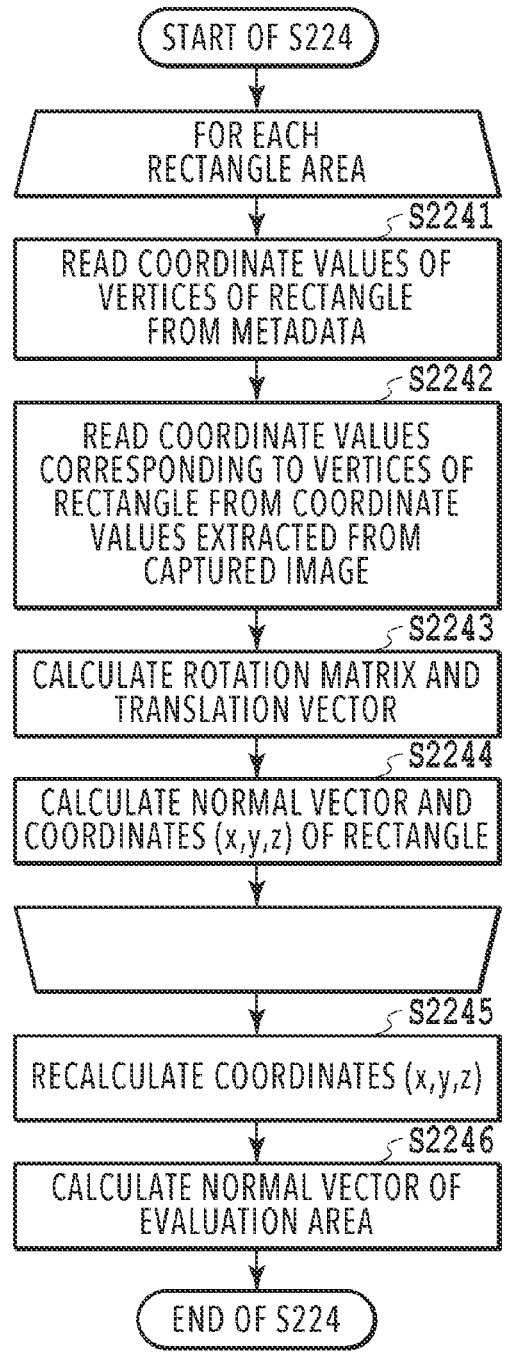
FIG. 5B is a flowchart illustrating a process of generating geometric data on an object.

FIGS. 5A and 5B are flowcharts illustrating a process of generating geometric data on the object 4 which is the target of the color evaluation, according to the first embodiment. Of the two flow charts, FIG. 5B is a flowchart illustrating details of the process at S224 in FIG. 5A.

In FIG. 5A, at S221, the geometric-data generation unit 202 first reads the captured image data obtained by the captured-image-data obtaining unit 201. Next, at S222, the geometric-data generation unit 202 reads metadata including information on the marker 6.

Figure 6:
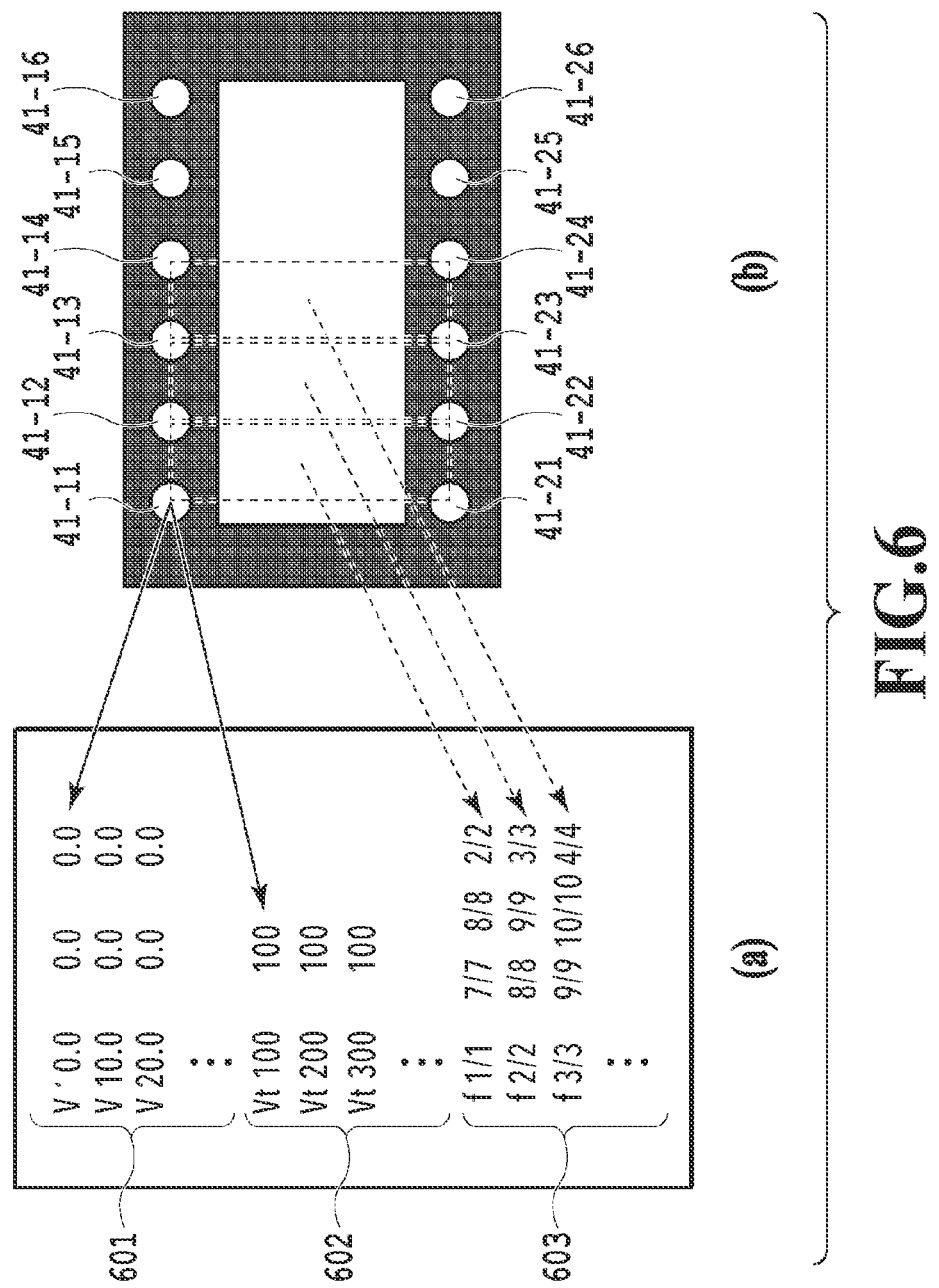
FIG. 6 is a diagram illustrating an example of metadata including information on a marker attached on an object.

FIG. 6 is a diagram illustrating an example of this metadata. The left part of FIG. 6 illustrates contents recorded as metadata. The area 601 records the three-dimensional coordinates (X,Y,Z) of the center points of the pattern areas 41 for the case where the marker 6 is placed flat, in other words, on the drawing plane of FIG. 6. In the example illustrated in FIG. 6, the coordinates of the pattern area 41-11 are (0.0, 0.0, 0.0); the coordinate values of the pattern area 41-12, (10.0, 0.0, 0.0) the coordinate values of the pattern area 41-13, (20.0, 0.0, 0.0); and so on. In the example illustrated in FIG. 6, the coordinates (X,Y,Z) of the pattern area 41-11 to the pattern area 41-26 are recorded in 12 lines. As seen from the above explanation, these coordinates show the relative positions with respect to the origin point for the case where the center point of the upper left pattern area 41-11 is defined as the origin point (0.0, 0.0, 0.0). The area 602 records the two-dimensional coordinates (u,v) of the center point of each pattern area 41 in the image of the marker 6. In the example illustrated in FIG. 6, the coordinate values of the pattern area 41-11 are (100, 100); the coordinates of the pattern area 41-12, (200, 100); the coordinates of the pattern area 41-13, (300, 100); and so on. In the example illustrated in FIG. 6, the coordinates (u,v) of the pattern areas 41-11 to 41-26 are recorded in 12 lines. As seen from the above explanation, the two-dimensional coordinates (u,v) show two-dimensional coordinates in units of the pixels of the marker image, which are recorded in 12 lines. The area 603 records polygon information. The polygons in the example illustrated in FIG. 6 each are a rectangle the vertices of which are the center points of four pattern areas 41-1k, 41-2k, 41-2k+1, 41-k+1. The polygon information is information on the vertices that define each rectangle. Specifically, in the polygon information, each line includes information indicating the line numbers in the area 601 and the line numbers in the area 602 of the four vertices of a rectangle, which are recorded in the order of viewing the four vertices on the outer periphery of the rectangle counterclockwise. For example, for the rectangle defined by the vertices 41-11, 41-21, 41-22, and 41-12, the vertex 41-11 is recorded in line 1 in the area 601 and in line 1 in the area 602, and the vertex 41-21 is recorded in line 7 in the area 601 and in line 7 in the area 602. The vertex 41-22 is recorded in line 8 in the area 601 and in line 8 in the area 602, and the vertex 41-12 is recorded in line 2 in the area 601 and in line 2 in the area 602. Thus, the record for this rectangle is 1/1, 7/7, 8/8, 2/2.

Referring to FIG. 5A again, at the following S223, the geometric-data generation unit 202 calculates the center coordinates of each pattern area 41 based on the image data obtained by capturing an image of the object 4. Specifically, the pixel values of the captured image data are binarized. In this binarization process, the pixel having a pixel value of a threshold value or larger is determined to be white, and the pixel having a pixel value smaller than the threshold value is determined to be black. In the binarized captured image, edge positions are determined by using a known Canny method, and pixels with at least one of eight neighboring pixels is in an edge position are grouped together as the same outline, thereby outline extraction being performed. Out of multiple outline groups thus extracted, outline candidates that show circles or ellipses are selected. Then, the area surrounded by a circular or elliptical outline selected as an outline candidate is calculated, and the calculated area of each outline and the multiple outlines of the pattern areas 41 set in advance are extracted to calculate the center coordinate values of each outline. Then, the center coordinates of the outlines are sorted such that the relative positional relationship between the center coordinate values of the outlines agrees with the relative positional relationship between the coordinates written in the area 602. Through this process, the rectangles defined in the area 603 are associated with the center coordinates of the pattern areas 41 corresponding to the rectangles.

Next, at S224, the geometric-data generation unit 202 calculates the normal vectors on the surface of the object 4 based on the center coordinates of each pattern area 41 to generate geometric data representing the calculated normal vectors.

FIG. 5B is a flowchart illustrating the geometric-data generation process in S224.

First, at S2241, the geometric-data generation unit 202 reads the three-dimensional coordinate values (X,Y,Z) of the vertices of a rectangle from the metadata. Specifically, the geometric-data generation unit 202 reads a line of polygon information indicated in the area 603 from the metadata and then reads the coordinate values of each vertex of the rectangle indicated in the polygon information from the area 601. Next, at S2242, the geometric-data generation unit 202 reads the center coordinates of the pattern areas 41 calculated from the captured image data at S223 as the coordinate values corresponding to the vertices of the rectangle read at S2241. The order of the center coordinates of the pattern areas 41 has been sorted at S223 so as to agree with the order of the coordinate values recorded in the area 602. Hence, at S2242, the center coordinates corresponding to the vertex numbers recorded in the area 603 are extracted in a way the same as or similar to that in S2241.

Next, at S2243, the geometric-data generation unit 202 estimates the rotation matrix R having coefficients $r_{11}$ to $r_{33}$ and the translation vector t having coefficients $t_1$ to $t_3$ expressed by the following Expression (1). This process calculates the position and orientation of the image capturing apparatus 2 relative to the plane of the rectangle.

$$s \begin{bmatrix} u \\ v \\ 1 \end{bmatrix} = \begin{bmatrix} f_x & 0 & c_x \\ 0 & f_y & c_y \\ 0 & 0 & 1 \end{bmatrix} [R|t] \begin{bmatrix} X \\ Y \\ Z \\ 1 \end{bmatrix} \quad (1)$$

$$R = \begin{bmatrix} r_{11} & r_{12} & r_{13} \\ r_{21} & r_{22} & r_{23} \\ r_{31} & r_{32} & r_{33} \end{bmatrix}$$

$$t = \begin{bmatrix} t_1 \\ t_2 \\ t_3 \end{bmatrix}$$

Here, $f_x$ and $f_y$ are the focal lengths of the image capturing apparatus 2 in the x and y directions in the three-dimensional space the origin of which is the position of the image capturing apparatus 2. The symbols $c_x$ and $c_z$ represent the position of the principal point of the image capturing apparatus 2 in the x and z directions. The values $f_x$, $f_y$, $c_x$, and $c_z$ are predetermined values and stored in the HDD 17 in advance. The coordinates (u,v) in Expression (1) are the center coordinates of the pattern areas 41 in the captured image read at S2242. The coordinates (X, Y. Z) in Expression (1) are the three-dimensional coordinates recorded in the metadata read at S2241, corresponding to the coordinates (u,v). The symbol s represents a scaling factor the value of which is the reciprocal of the third row element of the three-dimensional vector obtained by calculating the right side of Expression (1) so that the value of the third row element becomes 1. Three or more combinations of the coordinates (u,v) and the coordinates (X,Y,Z) corresponding to the coordinates (u,v) as described above are used to estimate the rotation matrix and the translation vector.

Next, at S2244, the geometric-data generation unit 202 calculates the three-dimensional coordinates (x,y,z), the origin point of which is the position of the image capturing apparatus 2, of each vertex of the rectangle and the normal vector of the plane including those vertices. First, with the following Expression (2), the three-dimensional coordinates (x,y,z) of each vertex is calculated.

$$\begin{bmatrix} x \\ y \\ z \end{bmatrix} = R \begin{bmatrix} X \\ Y \\ Z \end{bmatrix} + t \quad (2)$$

Here, R represents the rotation matrix calculated at S2243, and t represents the translation vector calculated at S2243. The coordinates (X,Y,Z) are the three-dimensional coordinates of each vertex in the metadata read at S2241. Next, the geometric-data generation unit 202 sets the coordinates (x,y,z) of one vertex of the rectangle as an origin point and calculates the vectors from the origin to the coordinates (x,y,z) of other two vertices. Then, the geometric-data generation unit 202 calculates the unit vector in the direction of the cross product of the two calculated vectors. The unit vector is the normal vector of the surface of the rectangle. Note that in the case where the Z values of the coordinates (X,Y,Z) of the vertices are the same, the unit vector having elements of $r_{13}$, $r_{23}$, and $r_{33}$ which are the elements at the third column of the rotation matrix R may be used as the normal vector.

The geometric-data generation unit 202 performs all the processes from the foregoing S2241 to S2244 for every rectangle area and thereby obtains the three-dimensional coordinates (x,y,z), the origin point of which is the position of the image capturing apparatus 2, of the vertices of every rectangle. Even in the case where the surface of the object 4 is curved, the coordinates thus obtained can be regarded as the three-dimensional coordinate values of the object 4 as long as the vertices are arranged at intervals narrow enough to regard each rectangle as a plane.

At S2245, the geometric-data generation unit 202 determines the three-dimensional coordinates (x,y,z) of the centers of the pattern areas 41. The pattern areas 41 corresponding to the vertices of a rectangle, calculated through the above processes S2241 to S2244 and those corresponding to the vertices of an adjoining rectangle include the same pattern areas 41 as illustrated in FIG. 6. However, since the rotation matrix R and the translation vector t are different for each rectangle, different vertex coordinates are assigned to the multiple vertices corresponding to those duplicated pattern areas 41 for each rectangle that the vertices belong to. Hence, at S2245, the geometric-data generation unit 202 recalculates, from the multiple sets of vertex coordinates obtained because of the duplication, one set of three-dimensional coordinates (x,y,z) for one pattern area 41 corresponding to those multiple sets. Specifically, for each rectangle, the geometric-data generation unit 202 first calculates a plane that includes the vertices corresponding to duplicated pattern areas 41 that also serve as vertices of an adjoining rectangle and has a normal the same as the normal vector of the rectangle. Next, the geometric-data generation unit 202 calculates the straight line that passes through the coordinates of a nonduplicated vertex and the origin point which is the position of the image capturing apparatus 2 and determines the intersection point of the straight line and the calculated plane to be the new coordinates of the nonduplicated vertex. The recalculation of the coordinates as described above enables the normal vector of each rectangle to be maintained. Note that the average values of the sets of the coordinates (x,y,z) of a duplicated vertex may be regarded as the three-dimensional coordinate values of the center of the corresponding pattern area 41.

At 52246, the geometric-data generation unit 202 generates geometric data in which the normal vector calculated for each rectangle is recorded for each pixel. Here, assuming that all the points in a rectangle have the same normal vector, the normal vector $(n_x, n_y, n_z)$ is recorded for each pixel. Note that since the color evaluation in the present embodiment is performed for the evaluation area 42, normal vectors shown by the geometric data need to be recorded only for the pixels in the evaluation area 42.

<Process in S230: Obtaining Color Information on Reference Object>

In S230 (FIG. 3), the image-capturing control unit 203 determines a position on the object 4 where the color evaluation is to be performed based on the geometric data on the object 4 generated by the geometric-data generation unit 202 and obtains color information on the reference object corresponding to the position. Then, based on this color information, color evaluation is performed on the object 4. Specifically, an image of the reference object is captured in the same image-capturing conditions as in the case where the captured image data on the object 4 was obtained at S210. At this time, the position where the color evaluation is to be performed is specified in the geometric data on the object 4. After that, the image capturing apparatus 2 captures images of the reference object at specified time intervals, and only in the case where the difference between the face orientation of the specified position on the object 4 and the face orientation of the reference object becomes smaller than a threshold value, the image data captured at the time is stored in memory. During the image capturing, the face orientation of the reference object is variously changed by a person, a robot arm, or the like.

Figure 7:
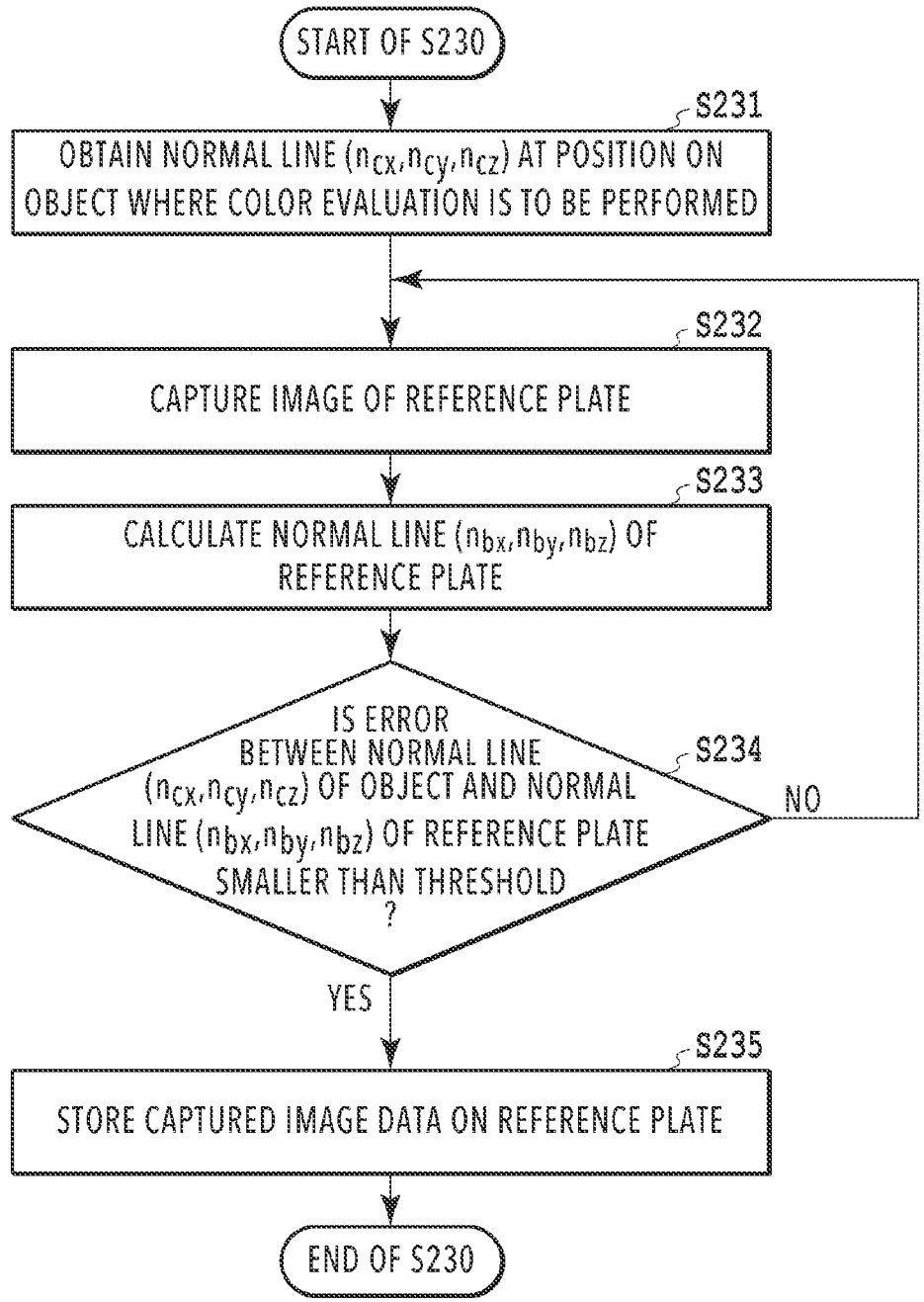
FIG. 7 is a flowchart illustrating a process of obtaining color information on a reference object.

FIG. 7 is a flowchart illustrating a process of obtaining color information on the reference object at S230.

Figure 8:
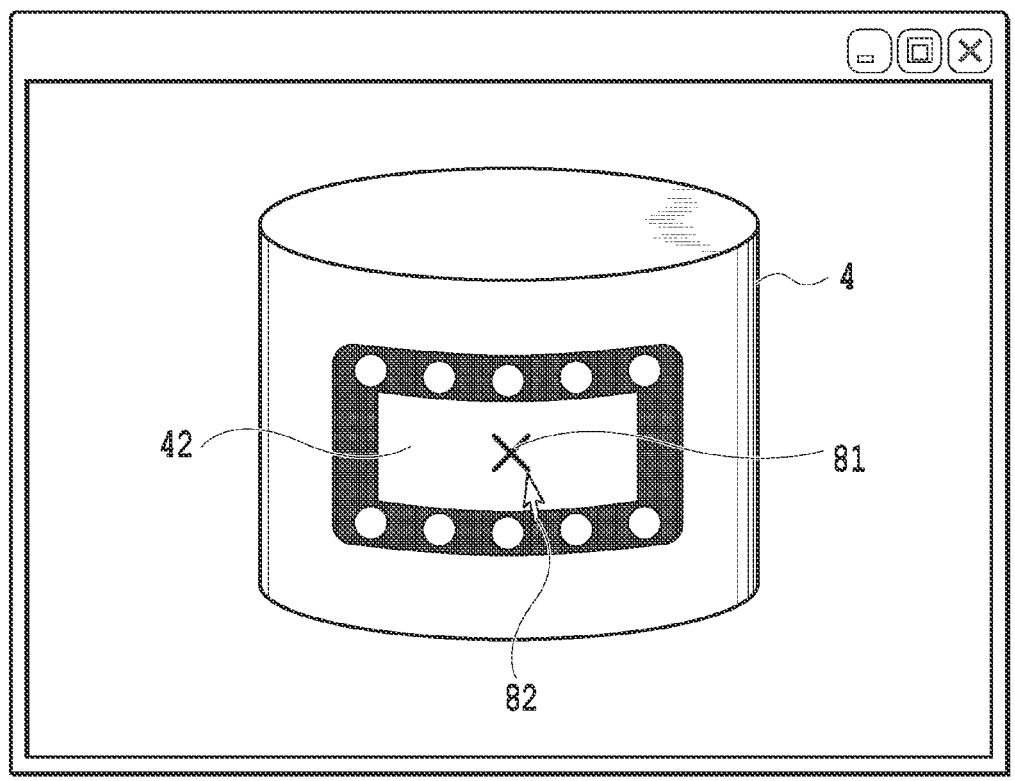
FIG. 8 is a diagram illustrating an example of a UI for specifying a position on an object where color evaluation is to be performed.

First, at S231, the image-capturing control unit 203 obtains the normal $(n_{cx}, n_{cy}, n_{cz})$ of the pixel position $(u_c, v_c)$ where color evaluation of the object 4 is to be performed in the geometric data on the object 4. The pixel position $(u_c, v_c)$ may be specified by using a value based on a user instruction input via the UI illustrated in FIG. 8 or by using a predetermined value. FIG. 8 illustrates an example UI, in which the pixel position $(u_c, v_c)$ 81 is specified with a pointer 82. The normal $(n_{cx}, n_{cy}, n_{cz})$ is the normal of the pixel position $(u_c, v_c)$, which is obtained from the geometric data on the object 4 generated by the geometric-data generation unit 202.

At S232, the image-capturing control unit 203 performs control to make the image capturing apparatus 2 capture an image of the reference plate 7. Then, at S233, the image-capturing control unit 203 obtains geometric data on the reference plate 7 from the captured image data obtained at S232 via the captured-image-data obtaining unit 201 and the geometric-data generation unit 202 and calculates the normal $(n_{bx}, n_{by}, n_{bz})$ of the reference plate 7.

Figure 9:
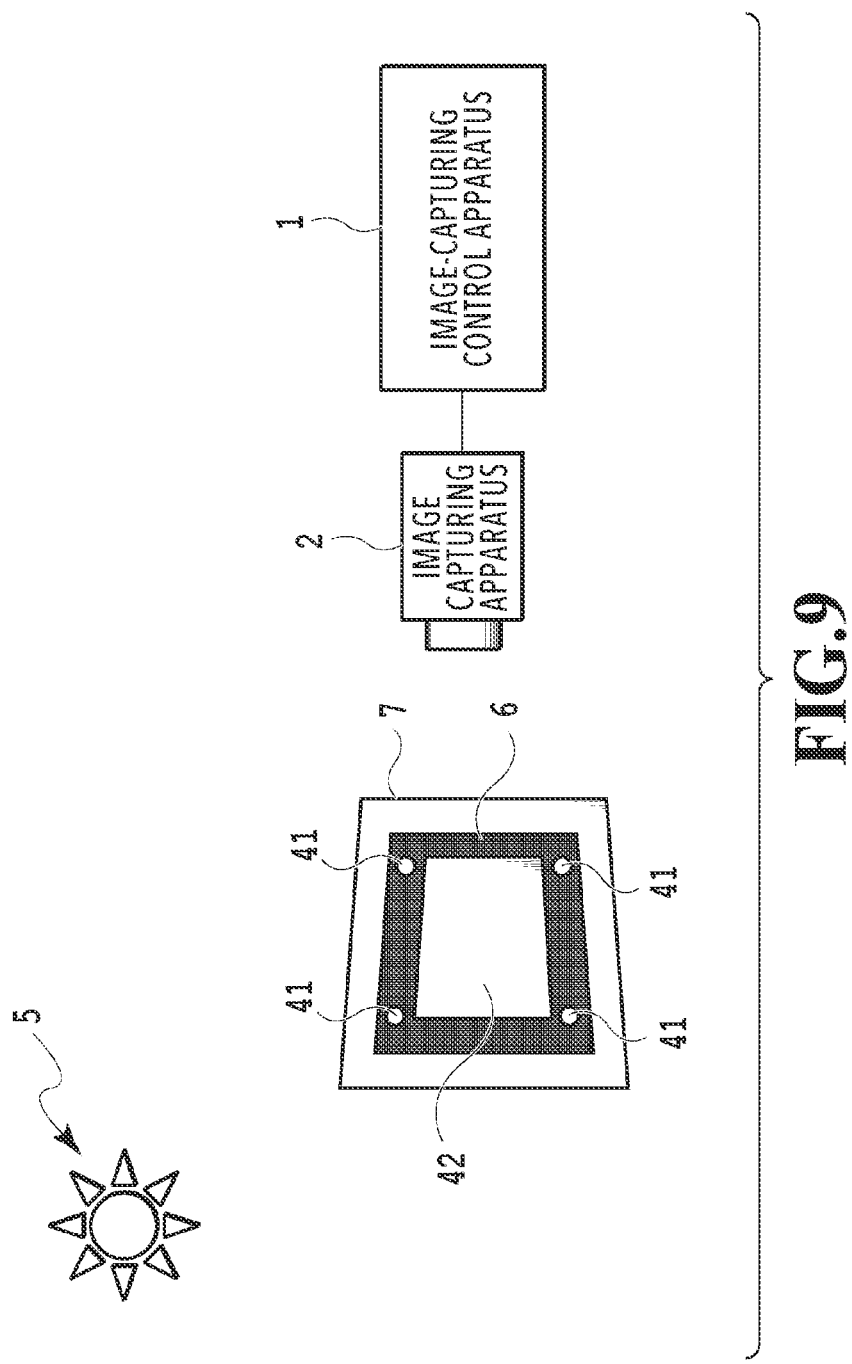
FIG. 9 is a diagram for explaining a method of calculating the three-dimensional shape of a reference plate.

In this normal calculation, first, the geometric-data generation unit 202 calculates the three-dimensional shape of the reference plate 7 based on the captured image data on the reference plate 7 obtained at S232. FIG. 9 is a diagram for explaining a method of calculating the three-dimensional shape of the reference plate 7, according to the first embodiment. In FIG. 9, the reference plate 7 has a marker 6 attached on it in a manner the same as or similar to the one in which the geometric data on the object 4 is obtained. The marker 6 has pattern areas 41 and an evaluation area 42. The evaluation area 42 is an area where part of the marker 6 is cut off Calculation of the three-dimensional shape of the reference plate 7 using the marker 6 is performed by the geometric-data generation unit 202 in a manner the same as or similar to the one in the process at S220 (FIG. 3) for calculating the three-dimensional shape of the object 4, and the geometric-data generation unit 202 generates geometric data on the reference plate 7 in which a normal is defined for each pixel. In the present embodiment, the image-capturing control unit 203 obtains the geometric data on the reference plate 7 generated by the geometric-data generation unit 202, and regards the average of the normals of the pixels in the evaluation area 42, calculated based on the geometric data, as the normal $(n_{bx}, n_{by}, n_{bz})$ of the reference plate 7.

Referring to FIG. 7 again, next, the image-capturing control unit 203, at S234, compares the normal $(n_{cx}, n_{cy}, n_{cz})$ of the object 4 obtained at S231 and the normal $(n_{bx}, n_{by}, n_{bz})$ of the reference plate 7 calculated at S233. Then, if the difference as a result of the comparison is smaller than a threshold value T, the image-capturing control unit 203 executes S235. If the difference equals or exceeds the threshold value, the process returns to S232, and the image-capturing control unit 203 repeats the subsequent processes while changing the face orientation of the reference plate 7.

At S234, the difference between the normal $(n_{cx}, n_{cy}, n_{cz})$ of the object 4 and the normal $(n_{bx}, n_{by}, n_{bz})$ of the reference plate 7 is the angular difference between the two vectors, which is calculated with Expression (3).

$$\cos^{-1}(\text{dot}((n_{cx}, n_{cy}, n_{cz}),(n_{bx}, n_{by}, n_{bz}))) \quad (3)$$

Here, dot (•,•) represents the inner product of vectors. The threshold value T may be a predetermined value or may be one specified by the user separately. In the present embodiment, the process is performed on the assumption that the threshold value T=1 degree.

At S235, the image-capturing control unit 203 stores the captured image data on the reference plate 7 thus obtained in memory. This captured image data has color information for each pixel of the reference plate 7.

<Process in S240: Color Evaluation>

In S240, the color evaluation unit 301 calculates color evaluation values based on color information on the pixel of the position corresponding to the evaluation position $(u_c, v_c)$ in the captured image data on the object 4 and color information on the image of the reference plate 7 captured in the direction of the same normal as the one for the evaluation position. Specifically, first, the color evaluation unit 301 converts XYZ values into L*a*b* values using the following Expressions (4) to (8). Specifically, color information on the captured image data on the object 4 is expressed by (Xc, Yc, Zc), color information on the reference plate 7 is expressed by (Xb, Yb, Zb), and XYZ values of a reference white color are expressed by (Xw, Yw, Zw). The XYZ values of the reference white color are preset values. Then, the color evaluation unit 301 substitutes (Xc, Yc, Zc) and (Xb, Yb, Zb) for (X,Y,Z) in Expressions (4) to (8) to calculate (L*c,a*c,b*c) and (L*b,a*b,b*b), respectively.

$$\left. \begin{array}{l} \text{If } X/Xw > 0.00856, \\ XRate = (X/Xw)^{\frac{1}{3}} \\ \text{If } X/Xw \le 0.00856, \\ XRate = 7.787 \times (X/Xw) + 16.0/116.0 \end{array} \right\} \quad (4)$$

$$\left. \begin{array}{l} \text{If } Y/Yw > 0.00856, \\ YRate = (Y/Yw)^{\frac{1}{3}} \\ \text{If } Y/Yw \le 0.00856, \\ YRate = 7.787 \times (Y/Yw) + 16.0/116.0 \end{array} \right\} \quad (5)$$

-continued $$\left.\begin{array}{l} \text{If } Z/Zw > 0.00856, \\ ZRate = (Z/Zw)^{\frac{1}{3}} \\ \text{If } Z/Zw \le 0.00856, \\ ZRate = 7.787 \times (Z/Zw) + 16.0/116.0 \end{array}\right\} \quad (6)$$

$$\left.\begin{array}{l} \text{If } Y/Yw > 0.00856, \\ L^* = 116.0 \times (Y/Yw)^{\frac{1}{3}} - 16.0 \\ \text{If } Y/Yw \le 0.00856, \\ L^* = 903.29 \times (Y/Yw) \end{array}\right\} \quad (7)$$

$$\left.\begin{array}{l} a^* = 500 \times (XRate - YRate) \\ b^* = 200 \times (YRate - ZRate) \end{array}\right\} \quad (8)$$

The color evaluation unit 301 uses calculated (L*c,a*c, b*c) and (L*b,a*b,b*b) to calculate the color difference ΔE, the lightness difference ΔL*, Δa*, Δb*, or the color saturation difference ΔC as an evaluation value. Evaluation values are calculated using the following Expressions (9). In the present embodiment, it is assumed that the color a difference ΔE is predetermined to be the evaluation value.

$$\Delta E = \sqrt{(L^*c - L^*b)^2 + (a^*c - a^*b)^2 + (b^*c - b^*b)^2}$$

$$\Delta L^* = L^*c - L^*b$$

$$\Delta a^* = a^*c - a^*b$$

$$\Delta b^* = b^*c - b^*b$$

$$\Delta C = \sqrt{a^*c^2 + b^*c^2} - \sqrt{a^*b^2 + b^*b^2} \quad (9)$$

Note that a combined value of the color difference ΔE, the lightness difference ΔL*, Δa*, Δb, and the color saturation difference ΔC may be used for the evaluation value. Alternatively, the display 15 may show candidates for evaluation values, and the user may select evaluation values.

As has been described above, the color evaluation system of the present embodiment obtains a captured image only in the condition in which the difference between the normal of the position on an object where color evaluation is to be performed and the normal of the reference plate is smaller than a threshold value. The color evaluation system then performs color evaluation on the object and the reference plate based on the captured image. This process enables color evaluation with geometric conditions taken into account without generating profiles corresponding to multiple geometric conditions in advance.

Second Embodiment

In the foregoing first embodiment, the markers are attached to the object 4 and the reference plate 7 to obtain each piece of geometric data. However, in the case where design values or CAD data for the object 4 is available, a marker is not necessary to obtain the shape of the object 4. In a second embodiment, geometric data is obtained for an object the shape of which is already known with the above CAD data and other information without using a marker, and color evaluation is performed based on the geometric data. The following describes mainly the difference between the present embodiment and the first embodiment.

<Functional Configuration of Color Evaluation System>

Figure 10:
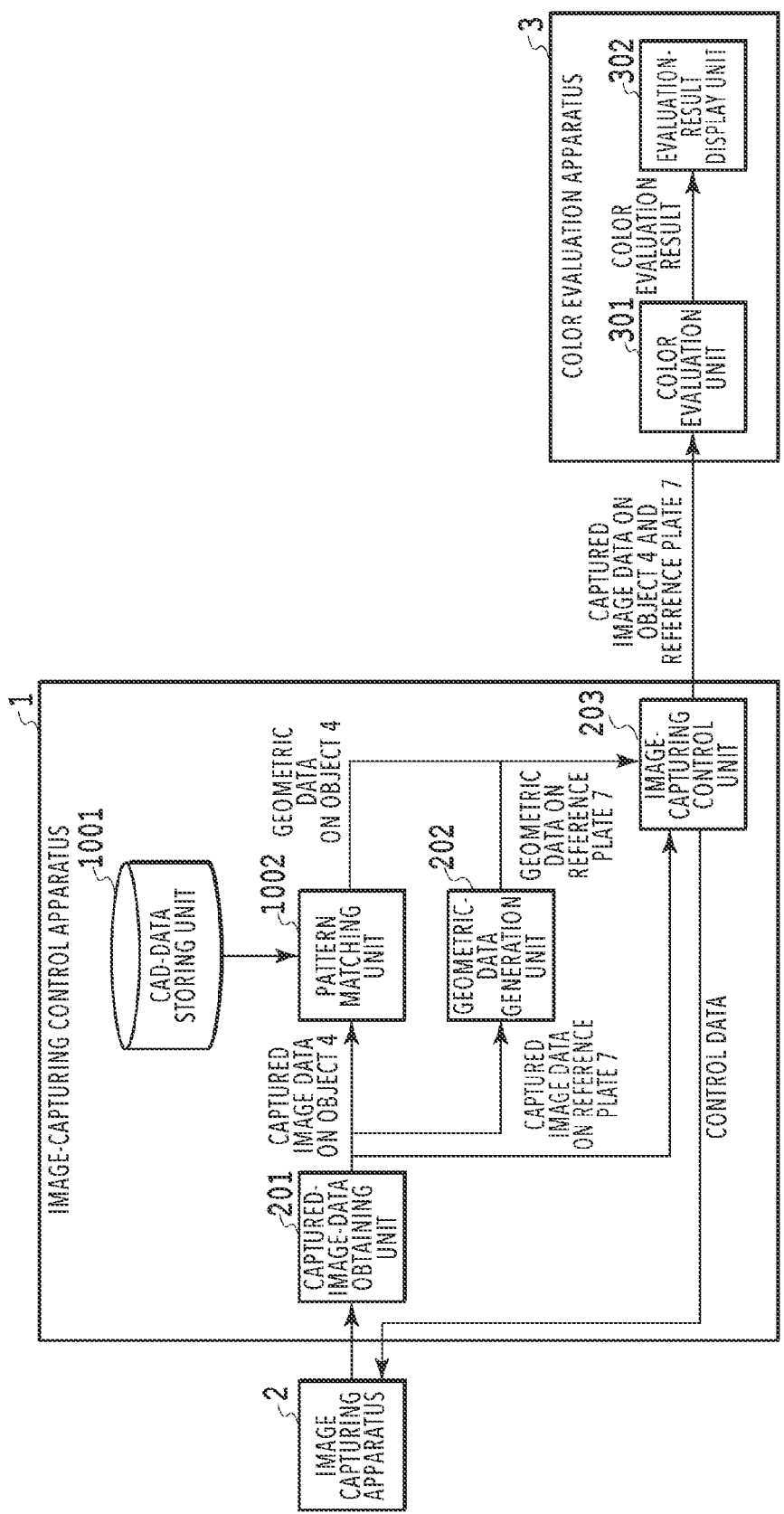
FIG. 10 is a block diagram illustrating the functional configuration of a color evaluation system.

FIG. 10 is a block diagram illustrating the functional configuration of a color evaluation system according to the second embodiment. The color evaluation system of the present embodiment includes an image-capturing control apparatus 1 and a color evaluation apparatus 3, and the image-capturing control apparatus 1 includes a captured-image-data obtaining unit 201, geometric-data generation unit 202, image-capturing control unit 203, CAD-data storing unit 1001, and pattern matching unit 1002. The color evaluation apparatus 3 includes a color evaluation unit 301 and an evaluation-result display unit 302. The captured-image-data obtaining unit 201, geometric-data generation unit 202, image-capturing control unit 203, color evaluation unit 301, and evaluation-result display unit 302 are units the same as or similar to those in the first embodiment, and hence description thereof is omitted.

The CAD-data storing unit 1001 stores CAD data representing an approximate shape of the object 4. The pattern matching unit 1002 performs pattern matching based on the captured image data and the CAD data to generate geometric data on the object 4.

<Process in Color Evaluation System>

Figure 11:
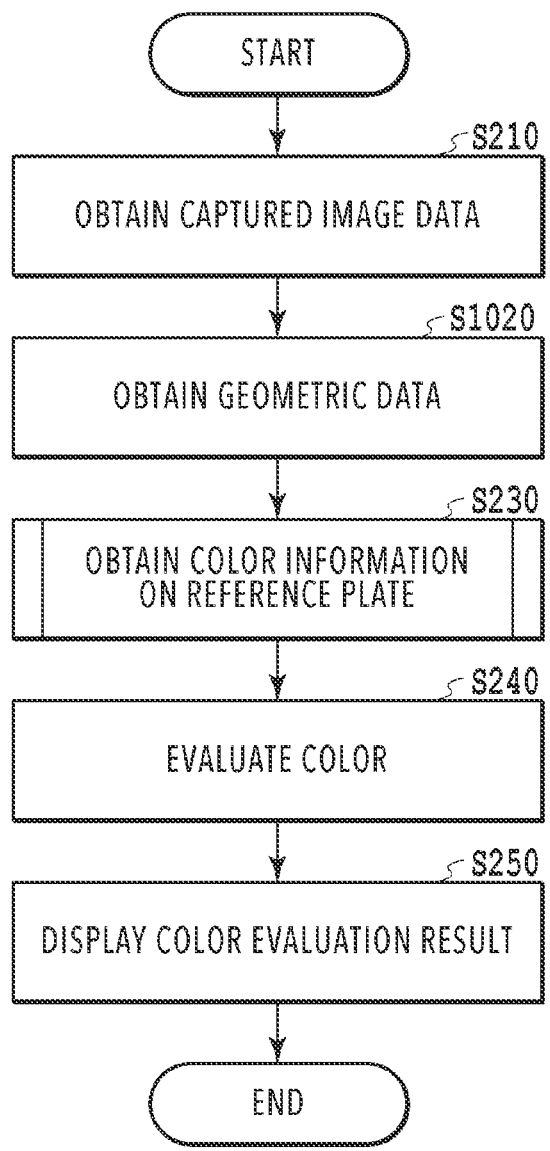
FIG. 11 is a flowchart illustrating a process in the color evaluation system.

FIG. 11 is a flowchart illustrating a process in the color evaluation system according to the second embodiment. S210 is the same process as that in the first embodiment, and hence description thereof is omitted.

Figures 12A, 12B:
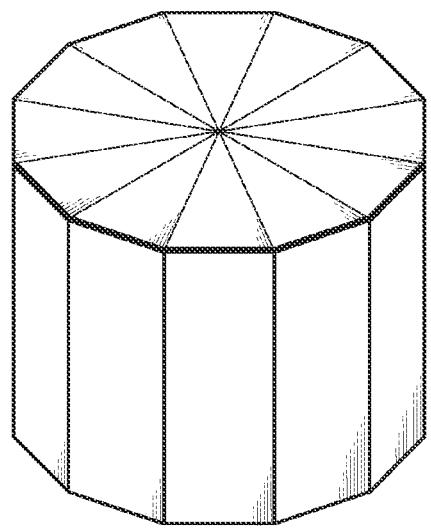
FIG. 12A is a diagram for explaining an example of CAD data on an object.
FIG. 12B is a diagram for explaining the example of the CAD data on the object.

After S210, at S1020, the pattern matching unit 1002 obtains the CAD data on the object 4 from the CAD-data storing unit 1001. FIGS. 12A and 12B are diagrams for explaining an example of the CAD data on the object 4 according to the second embodiment. The object 4 in the CAD data illustrated in FIG. 12A is composed of multiple polygons, and the CAD data illustrated in FIG. 12B records the three-dimensional coordinates of each vertex of the polygons. The pattern matching unit 1002 performs pattern matching based on this CAD data and captured image data to generate geometric data. Specifically, first, based on the CAD data, the pattern matching unit 1002 generates a simulated captured image in which the object 4 is at a virtual position and in a virtual orientation. The pattern matching unit 1002 repeats a process of determining whether the feature amounts of a captured image in a captured image data and the feature amounts of the simulated image agree with one another while changing the virtual position and orientation of the object 4. Then, the pattern matching unit 1002 calculates the correspondence relationship between the three-dimensional coordinates of the object 4 and the pixels in the captured image based on a simulation result having a virtual position and orientation with which the feature amounts agree with one another. Based on the calculated correspondence relationship, the pattern matching unit 1002 calculates the normal vectors corresponding to the pixels in the captured image to generate geometric data in which a normal vector is defined for each pixel. Each normal vector is obtained by calculating the normal of the corresponding polygon from the three-dimensional coordinates of the vertices. Geometric data in which a normal is defined for each pixel of the reference plate 7 is generated by the geometric-data generation unit 202 performing the same process (S220) as in the first embodiment.

The following S230, S240, and S250 are the same processes as those in the first embodiment, and hence description thereof is omitted.

As has been described above, the image-capturing control apparatus in the present embodiment uses geometric data generated based on CAD data to obtain the normals of the object 4 and performs color evaluation of the object 4. This process enables color evaluation with geometric conditions taken into account without using a marker for the object 4.

Third Embodiment

The first embodiment uses captured image data obtained by capturing images of the object 4 and the reference plate 7 with markers attached on them to obtain geometric data. The second embodiment uses CAD data on the object 4 and uses captured image data only for the reference plate 7, obtained by capturing an image of the reference plate 7 with a marker attached on it, to obtain geometric data. However, also for the reference plate 7, if the shape is known in advance, the marker is not necessary. The third embodiment relates to a configuration in which color evaluation of the object 4 is performed by using a marker only for the object 4 in the case where the shape of the reference plate 7 is known. In the following, portions of the present embodiment different from the first embodiment and the second embodiment are mainly described.

<Functional Configuration of Color Evaluation System>

Figure 13:
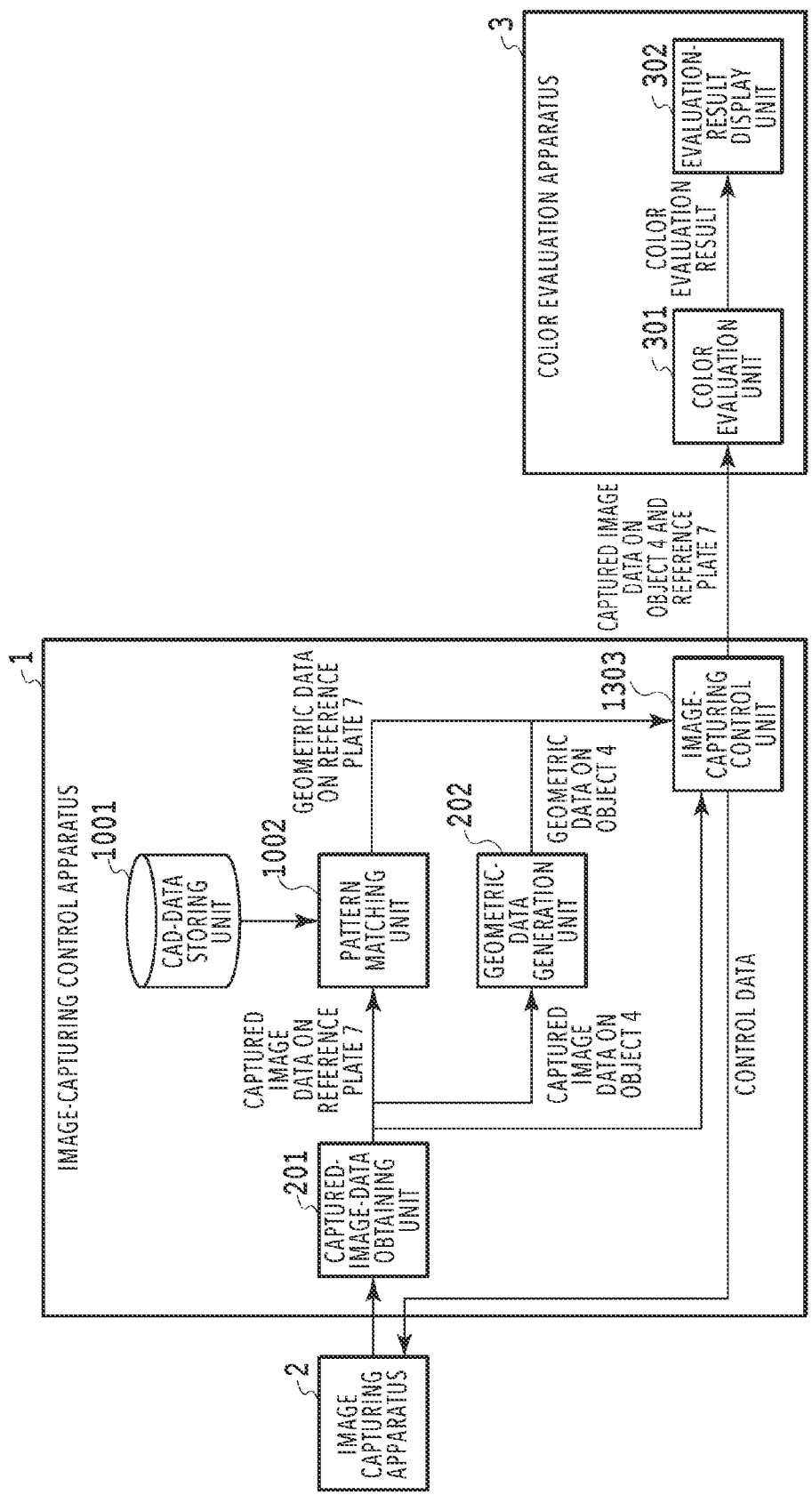
FIG. 13 is a block diagram illustrating the functional configuration of a color evaluation system.

FIG. 13 is a block diagram illustrating the functional configuration of a color evaluation system according to the third embodiment. The color evaluation system of the present embodiment includes an image-capturing control apparatus 1 and a color evaluation apparatus 3, and the image-capturing control apparatus 1 includes a captured-image-data obtaining unit 201, geometric-data generation unit 202, image-capturing control unit 1303, CAD-data storing unit 1001, and pattern matching unit 1002. The color evaluation apparatus 3 includes a color evaluation unit 301 and an evaluation-result display unit 302. The above configuration is the same one in the second embodiment, and hence description thereof is omitted.

The image-capturing control unit 1303 controls the image capturing apparatus 2 based on geometric data on the object 4 and the reference plate 7 to capture an image of the reference plate 7, and thereby obtains captured image data on the reference plate 7 via the captured-image-data obtaining unit 201. As described with reference to FIG. 14 and other figures, the image-capturing control unit 1303 of the present embodiment obtains the three-dimensional shape of the reference plate 7 based on CAD data by using the CAD-data storing unit 1001 and the pattern matching unit 1002. Note that the image-capturing control unit 1303 obtains the three-dimensional shape of the object 4 from the geometric-data generation unit 202 as in the first embodiment.

<Process in Color Evaluation System>

Figure 14:
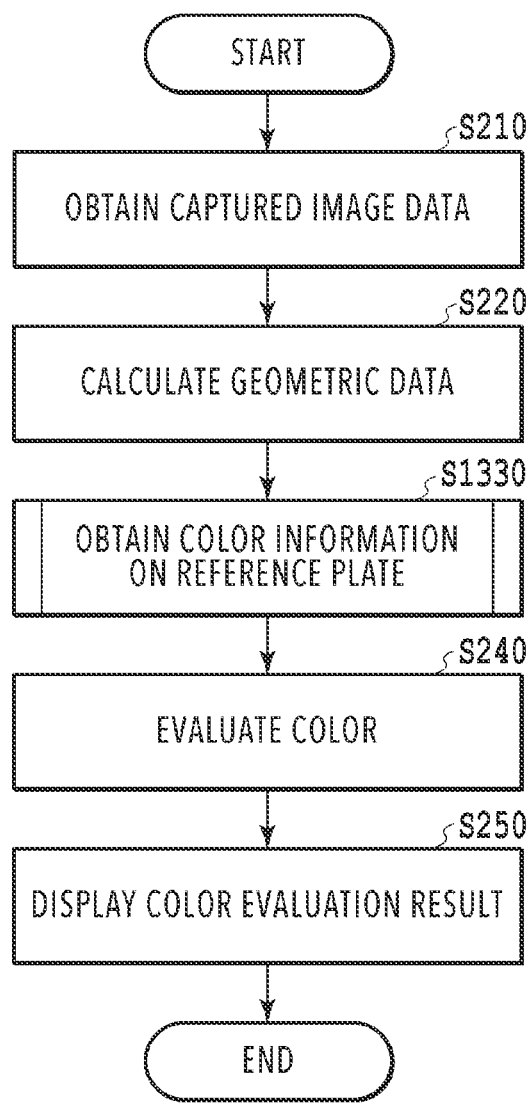
FIG. 14 is a flowchart illustrating a process in the color evaluation system.

FIG. 14 is a flowchart illustrating a process in the color evaluation system according to the third embodiment. The processes in S210 and S220 are the same as those in the first embodiment, and hence description thereof is omitted.

At S1330, the image-capturing control unit 1303, based on the geometric data on the object 4 and the reference plate 7, makes the image capturing apparatus 2 capture images of the reference object until the difference between the face orientation of the evaluation area on the object 4 and the face orientation of the reference plate 7 becomes smaller than a threshold value. In the case where the difference between the face orientations becomes smaller than the threshold value, the image-capturing control unit 1303 makes the image capturing apparatus 2 stop capturing images and obtains captured image data (color information) on the reference object for the case where the difference between the face orientations is smaller than the threshold value. In this image capturing, the image is captured in the same image-capturing conditions as when captured image data was obtained at S210. Details of the process in S1330 will be described later with reference to FIG. 15.

The processes in S240 and S250 in FIG. 14 are the same as those in the first embodiment, and hence description thereof is omitted.

<Process in S1330: Obtaining Color Information on Reference Plate>

Figure 15:
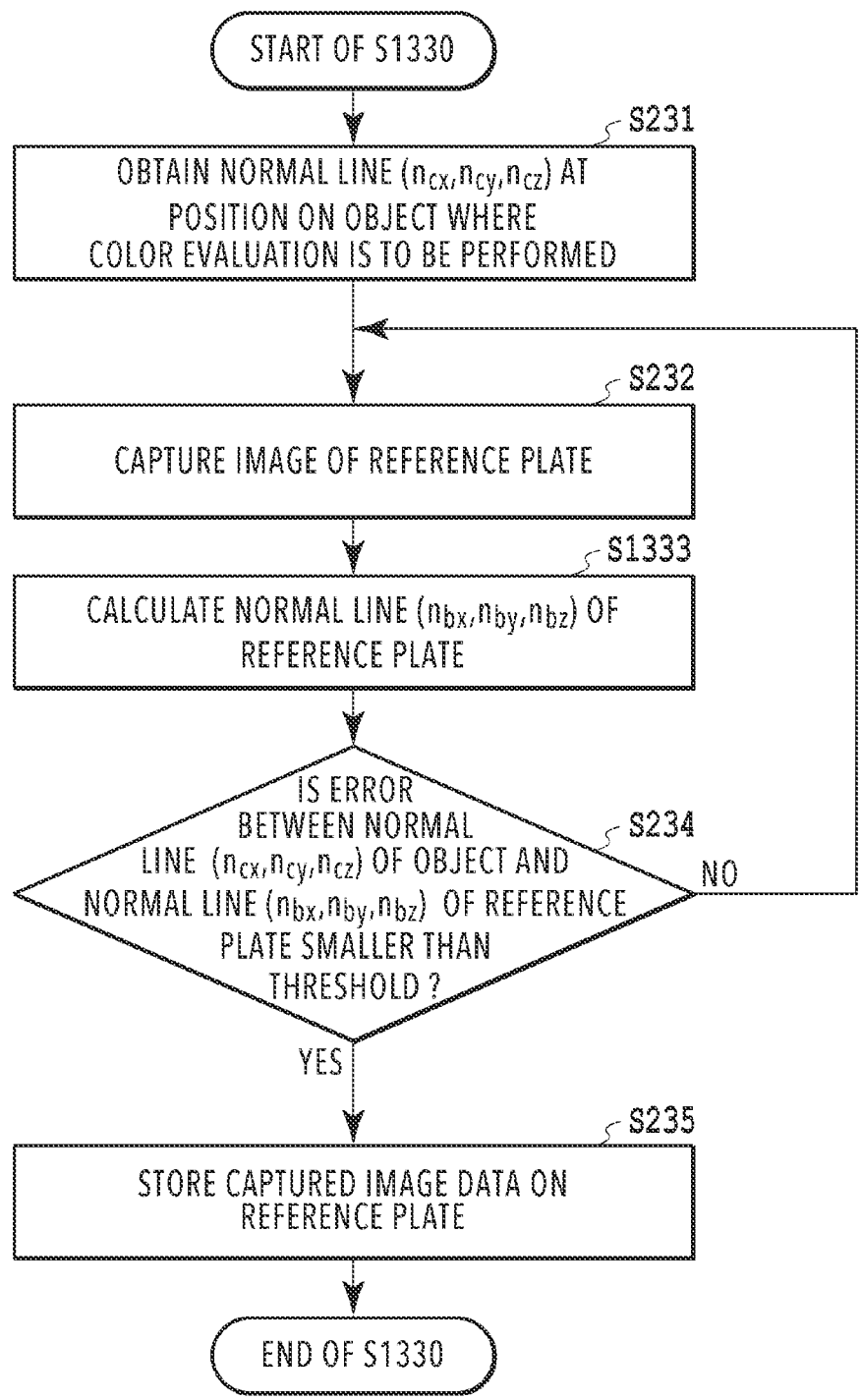
FIG. 15 is a flowchart illustrating a process of capturing an image of a reference plate.

FIG. 15 is a flowchart illustrating details of the process in S1330 illustrated in FIG. 14.

S231 and S232 are the same processes as those in the first embodiment, and hence description thereof is omitted.

At S1333, the image-capturing control unit 1303 calculates the normal ($n_{bx}$, $n_{by}$, $n_{bz}$) of the reference plate 7 from the image data captured at S232. Here, the image-capturing control unit 1303 first calculates the three-dimensional shape of the reference plate 7.

Figure 16:
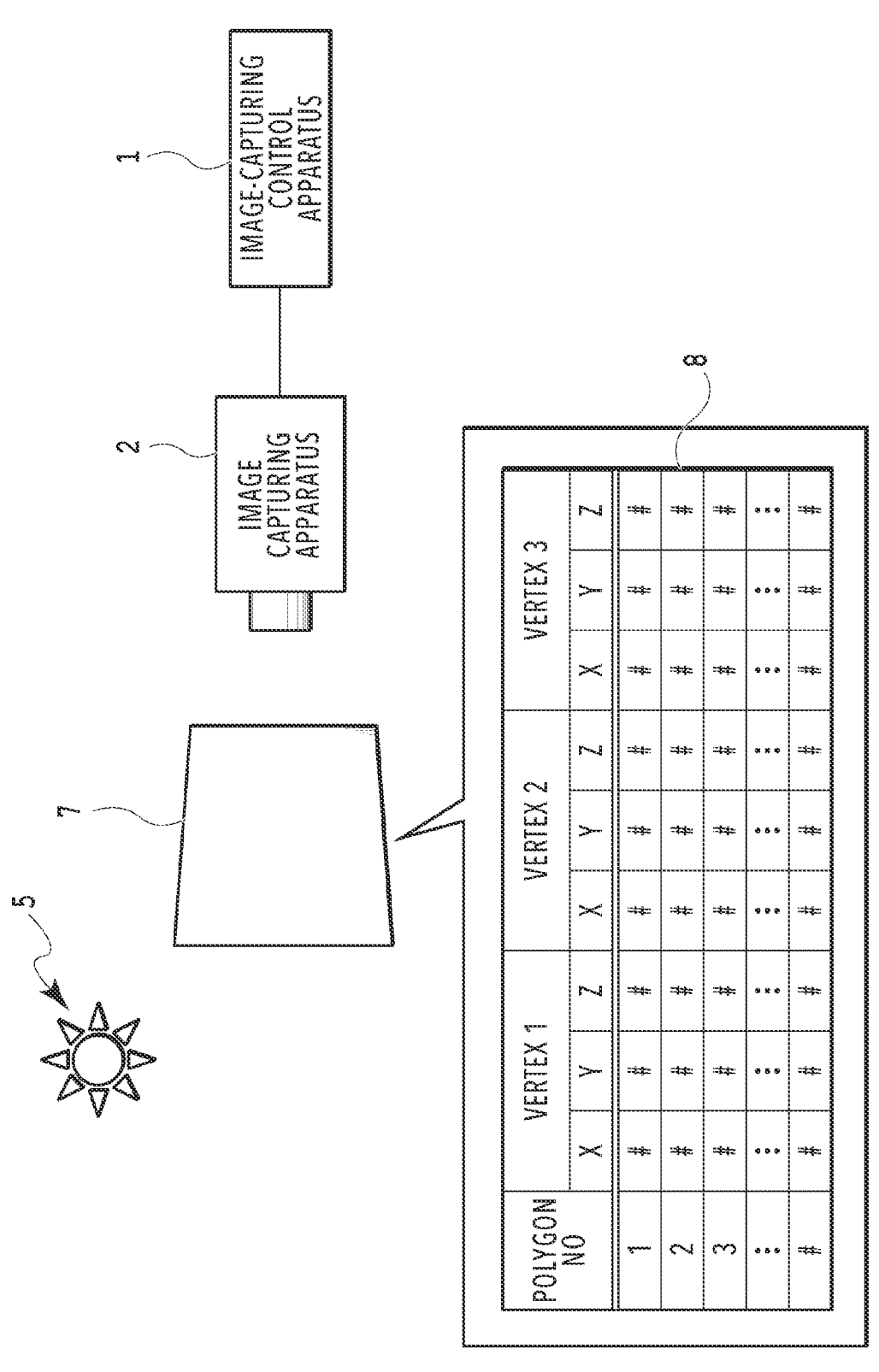
FIG. 16 is a diagram for explaining a method of calculating the three-dimensional shape of a reference plate.

FIG. 16 is a diagram for explaining a method of calculating the three-dimensional shape of the reference plate 7, according to the third embodiment. As illustrated in FIG. 16, the CAD data 8 corresponding to the reference plate 7 is available in the CAD-data storing unit 1001. Calculation of the three-dimensional shape of the reference plate 7 by the pattern matching unit 1002 using the CAD data 8 is a process the same as or similar to the one at S1020 in the second embodiment for obtaining the three-dimensional shape of the object 4 from CAD data. Through this process, geometric data on the reference plate 7 is generated in which a normal is defined for each pixel. Here, the average of the normals generated for the pixels in the evaluation area 42 is calculated, and the average is regarded as the normal ($n_{bx}$, $n_{by}$, $n_{bz}$) of the reference plate 7.

The processes in S234 and S235 are the same as those in the first embodiment, and hence description thereof is omitted.

As has been described above, the image-capturing control apparatus in the present embodiment uses geometric data generated based on CAD data to obtain the normals of the reference plate 7 and performs color evaluation of the object 4. This process enables color evaluation with geometric conditions taken into account without using a marker on the reference plate 7.

Fourth Embodiment

In the first, second, and third embodiments, the face of the reference plate 7 is turned to change the direction of the normal, and in the case where the difference from the normal of the position on the object 4 where color evaluation is to be performed becomes smaller than a threshold value, a captured image is stored, and color evaluation is performed with the captured image. However, there are cases in which even though the face orientation of the reference plate 7 is changed, the difference between the normal of the object 4 on which color evaluation is to be performed and the normal of the reference plate 7 does not become smaller than the threshold value. The fourth embodiment relates to a color evaluation system that indicates the direction to which the face orientation of the reference plate 7 should be changed in capturing an image of the reference plate 7, in order to make the normal of the position on the object 4 where color evaluation to be performed and the normal of the reference plate 7 in agreement with each other. In the following, portions of the present embodiment different from the first, second, and third embodiments are mainly described.

Functional Configuration of Color Evaluation System

Figure 17:
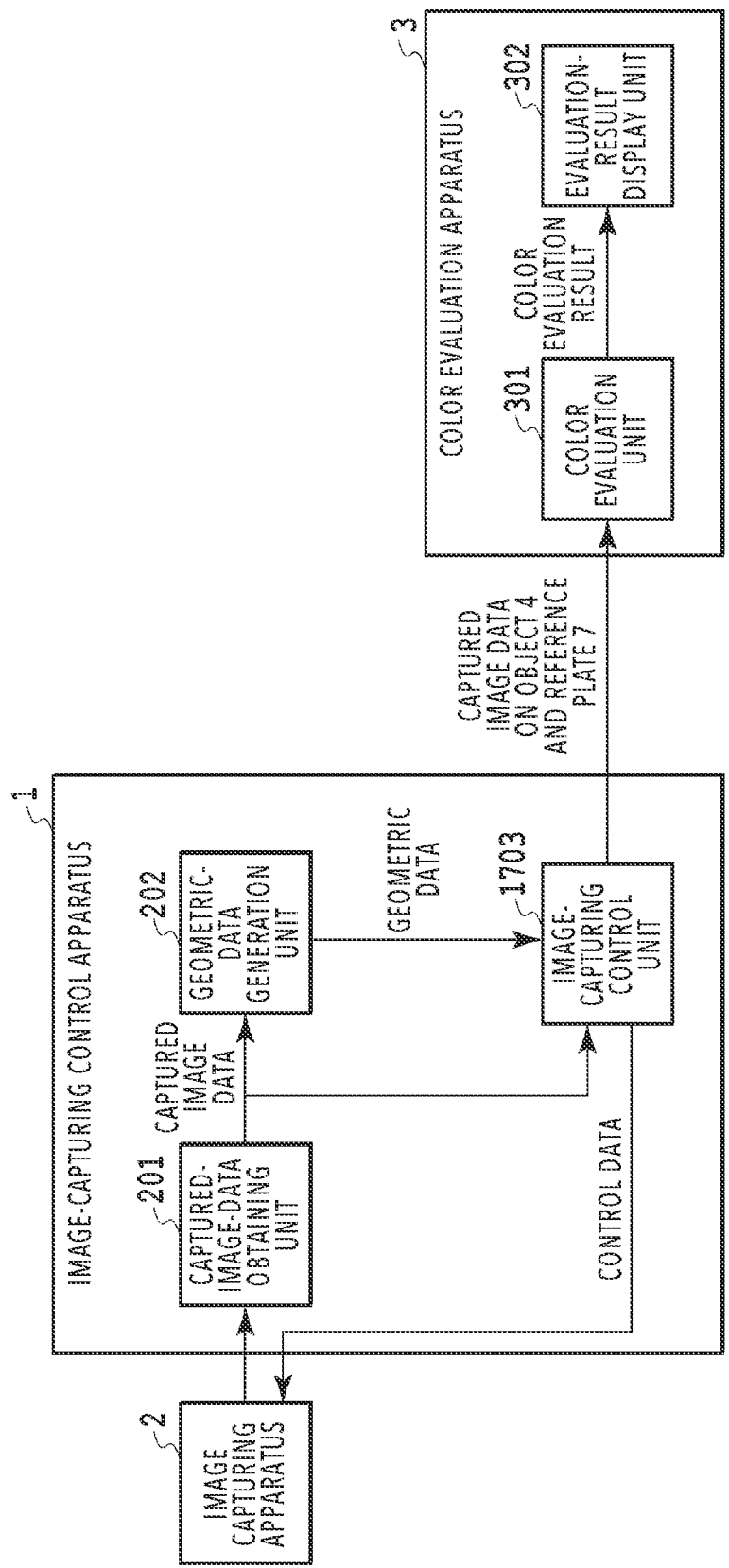
FIG. 17 is a block diagram illustrating the functional configuration of a color evaluation system.

FIG. 17 is a block diagram illustrating the functional configuration of a color evaluation system according to the fourth embodiment. The color evaluation system of the present embodiment includes an image-capturing control apparatus 1 and a color evaluation apparatus 3, and the image-capturing control apparatus 1 includes a captured-image-data obtaining unit 201, geometric-data generation unit 202, and image-capturing control unit 1703. The color evaluation apparatus 3 includes a color evaluation unit 301 and an evaluation-result display unit 302.

The captured-image-data obtaining unit 201, geometric-data generation unit 202, color evaluation unit 301, and evaluation-result display unit 302 are the same as those in the first embodiment, and hence description thereof is omitted.

The image-capturing control unit 1703 controls the image capturing apparatus 2 based on the geometric data derived by the geometric-data generation unit 202 to capture an image of the reference plate 7, and thereby obtains the captured image data via the captured-image-data obtaining unit 201. The image-capturing control unit 1703 of the present embodiment, as will be described later with reference to FIGS. 18 and 19 and other figures, indicates the direction to which the reference plate 7 should be turned on the UI and obtains the three-dimensional shape of the reference plate 7.

Process in Color Evaluation System

Figure 18:
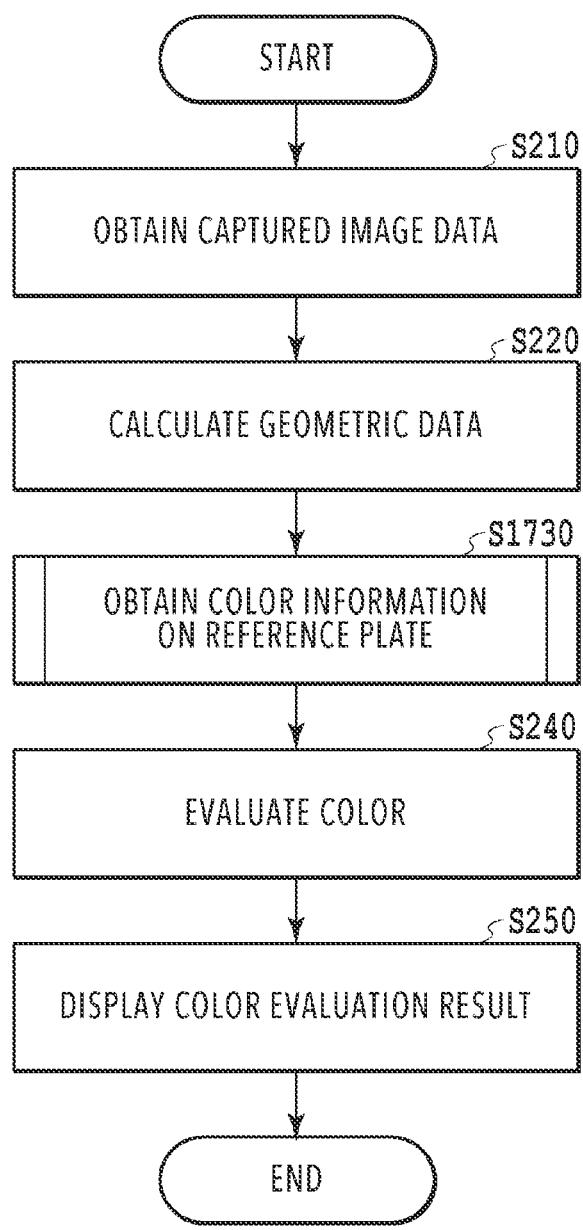
FIG. 18 is a flowchart illustrating a process in the color evaluation system.

FIG. 18 is a flowchart illustrating a process in the color evaluation system according to the fourth embodiment.

The processes in S210 and S220 are the same as those in the first embodiment, and hence description thereof is omitted.

At S1730, the image-capturing control unit 1703 controls the image capturing apparatus 2 to capture an image of the reference plate 7 and obtains geometric data on the reference plate 7 generated by the geometric-data generation unit 202 from captured image data obtained from the image capturing. Then, based on the geometric data on the object 4 and the reference object, the image-capturing control unit 1703 makes the image capturing apparatus 2 capture images of the reference object until the difference between the face orientation of the evaluation area on the object 4 and the face orientation of the reference plate becomes smaller than a threshold value. In the case where the difference between the face orientations becomes smaller than the threshold value, the image-capturing control unit 1703 makes the image capturing apparatus 2 stop capturing images and obtains captured image data (color information) on the reference object for the case where the difference between the face orientations is smaller than the threshold value. In this image capturing, the image is captured in the same image-capturing conditions as when captured image data was obtained at S210. Details of the process in S1730 will be described later with reference to FIG. 19.

The processes in S240 and S250 are the same as those in the first embodiment, and hence description thereof is omitted.

Process in S1730: Obtaining Color Information on Reference Plate

Figure 19:
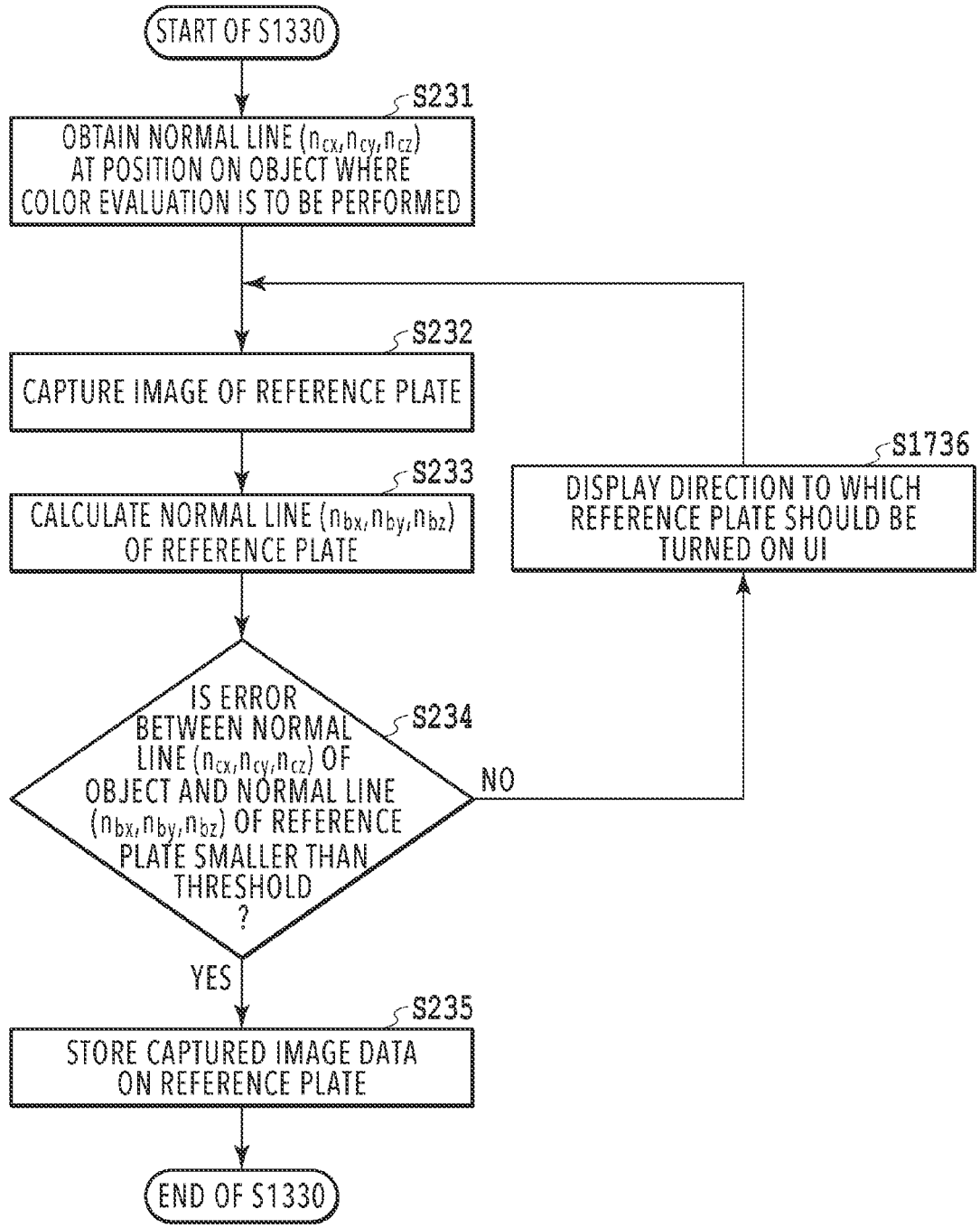
FIG. 19 is a flowchart illustrating a process of capturing an image of a reference plate.

FIG. 19 is a flowchart illustrating details of the process in S1730 illustrated in FIG. 18.

The processes in S231. S232, S233, S234, and S235 in FIG. 19 are the same as those in the first embodiment, and hence description thereof is omitted.

At S1736, in the case where the angular difference between the normal $(n_{cx}, n_{cy}, n_{cz})$ of the object 4 obtained at S231 and the normal $(n_{bx}, n_{by}, n_{bz})$ of the reference plate 7 generated at S233 equals or exceeds the threshold value T, the image-capturing control unit 1703 displays the direction to which the reference plate 7 should be turned on the UI to present it the user. Through this process, the difference mentioned above between the normals of the reference plate 7 and the object 4 is made small. Specifically, the angular difference between the normal $(n_{cx}, n_{cy}, n_{cz})$ of the object 4 and the normal $(n_{bx}, n_{by}, n_{bz})$ of the reference plate 7 expressed with zenith angle $\theta$ and azimuth angle $\phi$ in a spherical coordinate system is calculated, and the difference in zenith angle $\theta$ and the difference in azimuth angle $\phi$ are displayed on the UI. Specifically, the normal $(n_{cx}, n_{cy}, n_{cz})$ of the object 4 and the normal $(n_{bx}, n_{by}, n_{bz})$ of the reference plate 7 are converted into the representations with zenith angle $\theta$ and azimuth angle $\phi$ in the spherical coordinate system by using the following Expressions (10).

$$\left. \begin{array}{l} \theta_c = \mathrm{Cos}^{-1}(n_{cz}) \\ \phi_c = \mathrm{Tan}^{-1}(n_{cx}, n_{cy}) \\ \theta_b = \mathrm{Cos}^{-1}(n_{bz}) \\ \phi_b = \mathrm{Tan}^{-1}(n_{bx}, n_{by}) \end{array} \right\} \quad (10)$$

Here, $\mathrm{Tan}^{-1}(x,y)$ is a function that returns the arctangent of y/x within the range of $[-\pi, \pi]$. The zenith-angle difference $\theta d$ and the azimuth-angle difference $\phi d$ in the spherical coordinate system between the normals of the object 4 and the normal of the reference plate 7 can be determined by using the following Expressions (11).

$$\left. \begin{array}{l} \theta_d = \theta_b - \theta_c \\ \phi_b = \phi_b - \phi_c \end{array} \right\} \quad (11)$$

Figure 20:
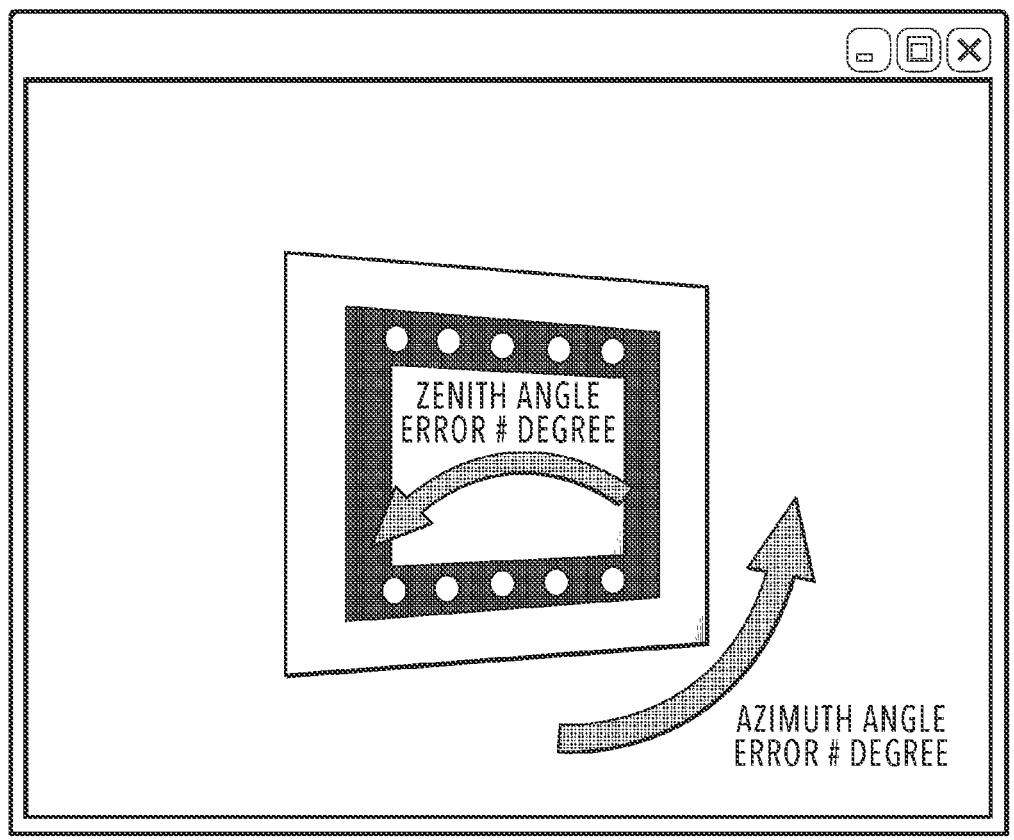
FIG. 20 is a diagram illustrating an example of a UI display.

These zenith-angle difference $\theta_a$ and azimuth-angle difference $\phi d$ are displayed on the UI to present the user with the direction to which the reference plate 7 should be turned. FIG. 20 is a diagram illustrating an example of UI display according to the fourth embodiment. As illustrated in FIG. 20, the differences in the zenith-angle and azimuth-angle directions are indicated by using numerical values and arrows with respect to a captured image of the reference plate 7.

As has been described above, the image-capturing control apparatus in the present embodiment presents the user with the direction to which the reference plate 7 should be turned and thereby enables capturing an image of the reference plate 7 in the same geometric conditions as for the object 4. With this process, it is possible to obtain image data on the reference plate 7 captured in the same geometric conditions as for the object 4 in a short time.

Fifth Embodiment

In the first, second, third, and fourth embodiments, color evaluation is performed on a specified position. Unlike those embodiments, the fifth embodiment relates to a configuration in which color evaluation is performed not on a specified position but over the entire evaluation area. In the following, portions of the present embodiment different from the first, second, third, and fourth embodiments are mainly described.

<Functional Configuration of Color Evaluation System>

Figure 21:
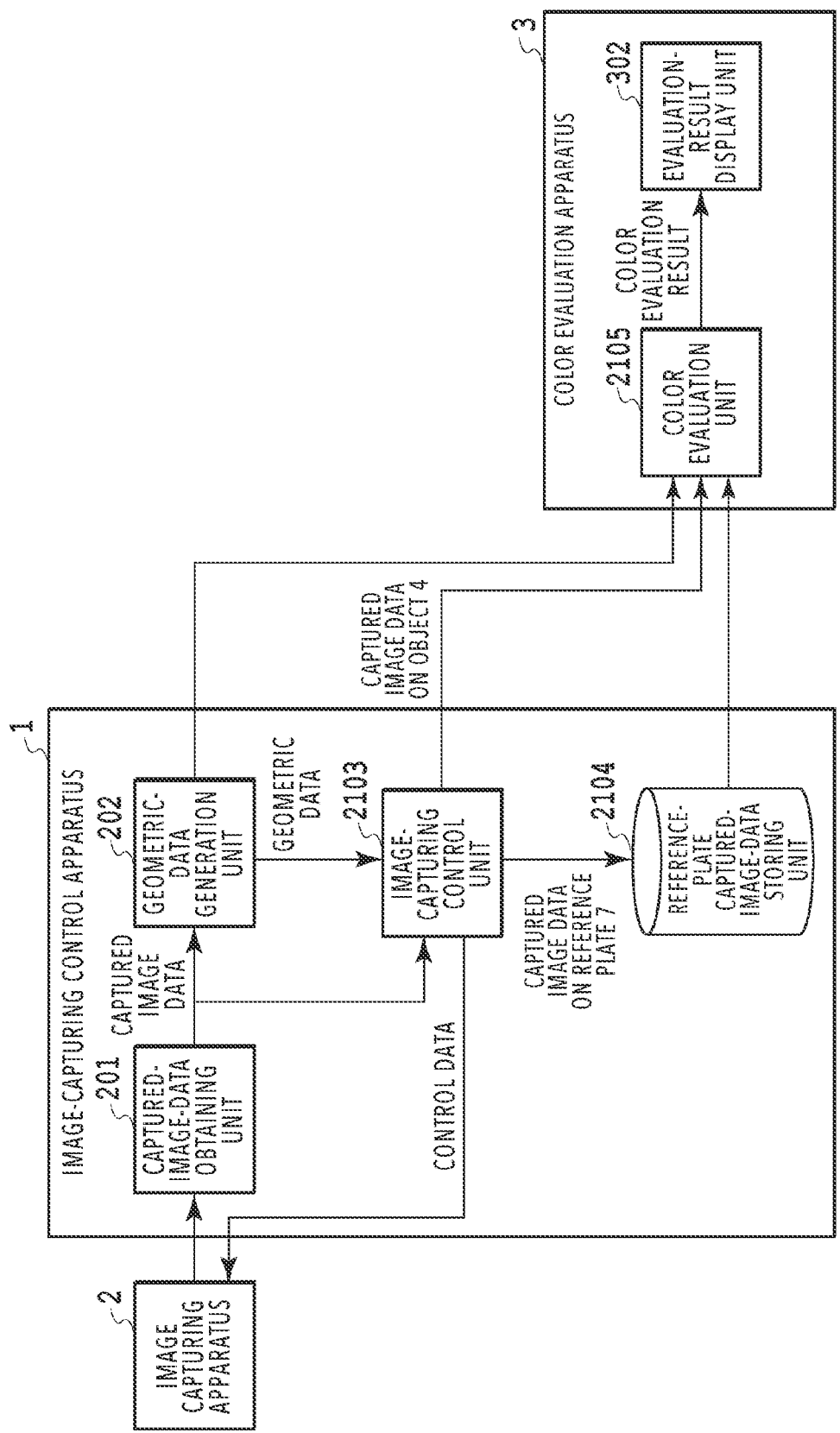
FIG. 21 is a block diagram illustrating the functional configuration of a color evaluation system.

FIG. 21 is a block diagram illustrating the functional configuration of a color evaluation system according to the fifth embodiment. The color evaluation system of the present embodiment includes an image-capturing control apparatus 1 and a color evaluation apparatus 3, and the image-capturing control apparatus 1 includes a captured-image-data obtaining unit 201, geometric-data generation unit 202, image-capturing control unit 2103, and reference-plate captured-image-data storing unit 2104. The color evaluation apparatus 3 includes a color evaluation unit 2105 and an evaluation-result display unit 302. The captured-image-data obtaining unit 201, geometric-data generation unit 202, and evaluation-result display unit 302 are the same as those units in the first embodiment, and hence description thereof is omitted.

The image-capturing control unit 2103 controls the image capturing apparatus 2 based on the geometric data on the object 4 and the reference plate 7 to capture an image of the reference plate 7, and thereby obtains captured image data on the reference plate 7 via the captured-image-data obtaining unit 201. The reference-plate captured-image-data storing unit 2104 stores the image data on the reference plate 7 thus captured. The color evaluation unit 2105 evaluates the color of the surface of the object 4 based on the captured image data on the object 4 captured by the image capturing apparatus 2 and the captured image data on the reference plate 7 generated by the image-capturing control unit 2103 and stored by the reference-plate captured-image-data storing unit 2104.

<Process in Color Evaluation System>

Figure 22:
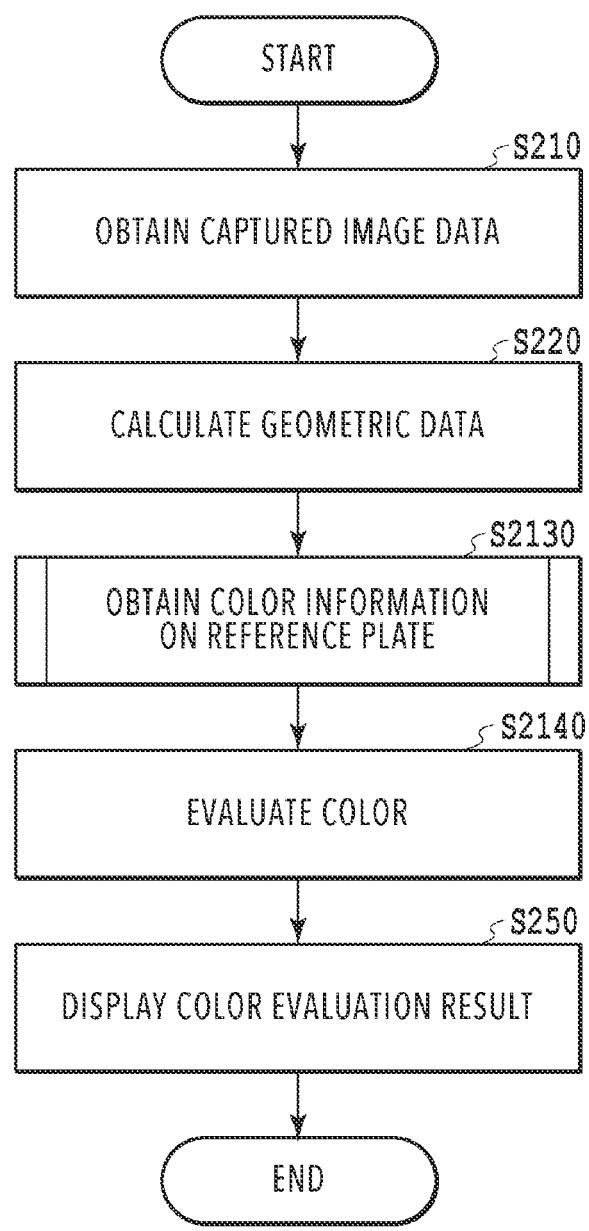
FIG. 22 is a flowchart illustrating a process in the color evaluation system.

FIG. 22 is a flowchart illustrating a process in the color evaluation system according to the fifth embodiment. The processes in S210, S220, and S250 are the same as those in the first embodiment, and hence description thereof is omitted.

At S2130, the image-capturing control unit 2103 obtains color information on the reference plate 7. Specifically, the image-capturing control unit 2103, based on the geometric data on the object 4 and the reference plate 7, makes the image capturing apparatus 2 capture images of the reference object until the difference between the face orientation of the evaluation area on the object 4 and the face orientation of the reference plate becomes smaller than a threshold value. In the case where the difference between the face orientations becomes smaller than the threshold value, the image-capturing control unit 2103 makes the image capturing apparatus 2 stop capturing images and obtains captured image data (color information) on the reference object for the case where the difference between the face orientations is smaller than the threshold value. In this image capturing, the image is captured in the same image-capturing conditions as when captured image data was obtained at S210. Then, the reference-plate captured-image-data storing unit 2104 stores the captured image data on the reference plate 7 thus captured. Details of the process in S2130 will be described later with reference to FIG. 23.

At S2140, the color evaluation unit 2105 evaluates the color of the surface of the object 4 based on the captured image data on the object 4 captured by the image capturing apparatus 2 and the captured image data on the reference plate 7 obtained by the image-capturing control unit 2103 controlling the image capturing apparatus 2 and stored by the reference-plate captured-image-data storing unit 2104. Details of the process in S2140 will be described later.

<Process in S2130: Obtaining Color Information on Reference Plate>

Figure 23:
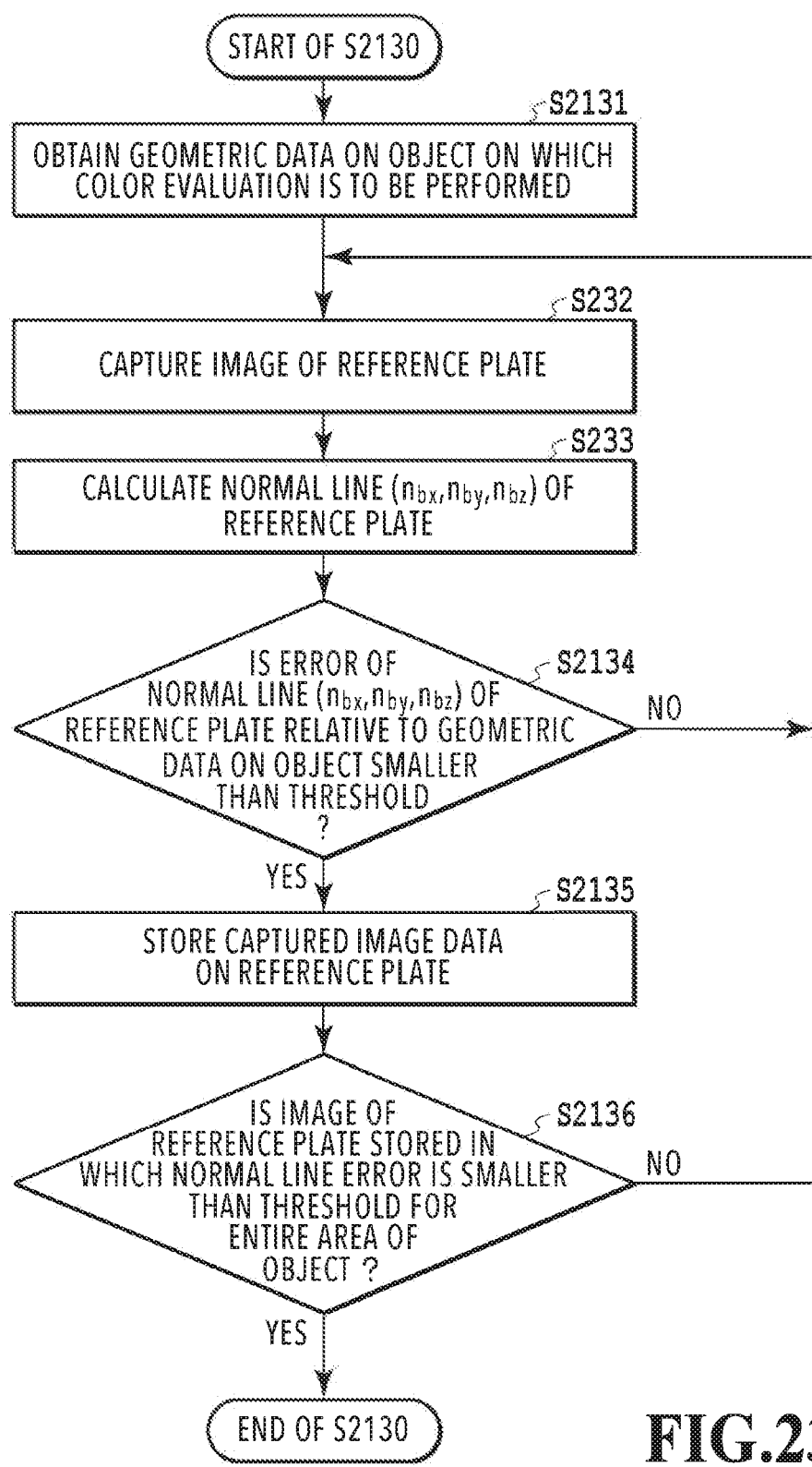
FIG. 23 is a flowchart illustrating a process of capturing an image of a reference plate.

FIG. 23 is a flowchart illustrating the process in S2130 illustrated in FIG. 22.

At S2131, the image-capturing control unit 2103 obtains the geometric data on the object 4 derived by the geometric-data generation unit 202. The processes in S232 and S233 are the same as those in the first embodiment, and hence description thereof is omitted.

Next, at S2134, the image-capturing control unit 2103 compares the normal ($n_{bx}$, $n_{by}$, $n_{bz}$) of the reference plate 7 obtained at S233 and the geometric data on the object 4. If the difference between the normals is smaller than a threshold value, the process proceeds to S2135, and if the difference equals or exceeds the threshold value, the process proceeds to S232. Here, the geometric data on the object 4 has a normal for each pixel, and the difference between the normal of every pixel and the normal ($n_{bx}$, $n_{by}$, $n_{bz}$) of the reference plate 7 is evaluated. In the case where there are one or more pixels on which the difference is smaller than the threshold value, the process proceeds to S2135.

Figure 24:
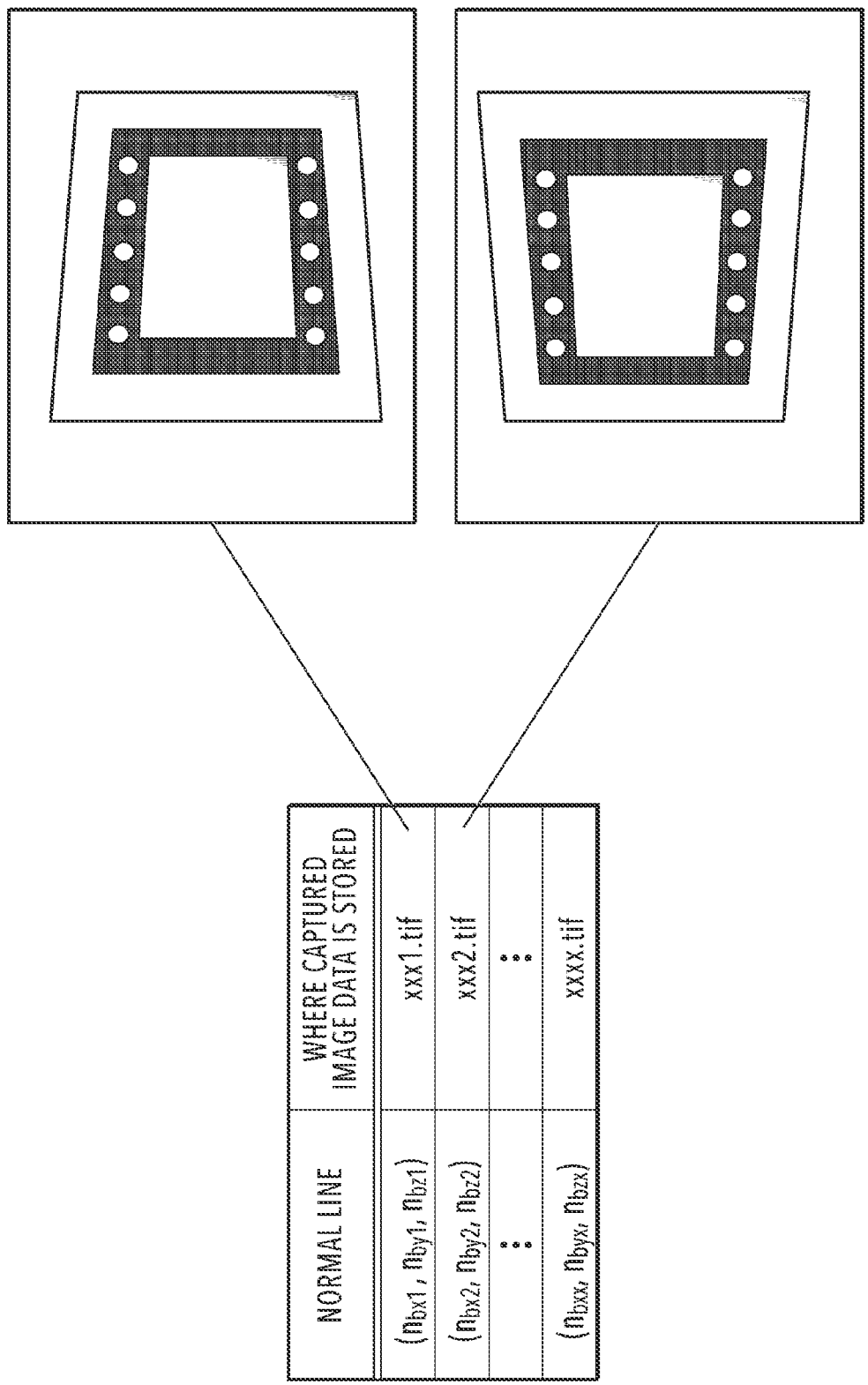
FIG. 24 is a diagram illustrating an example of a table stored in a reference-plate captured-image-data storing unit.

First, at S2135, the image-capturing control unit 2103 stores the captured image data on the reference plate 7 in the reference-plate captured-image-data storing unit 2104. FIG. 24 is a diagram illustrating an example of the reference-plate captured-image-data storing unit 2104 according to the fifth embodiment. The reference-plate captured-image-data storing unit 2104 has a table containing combinations each consisting of the normal ($n_{bx}$, $n_{by}$, $n_{bz}$) of the reference plate 7 when the image was captured and the location where the captured image data is stored.

At S2136, the image-capturing control unit 2103 determines whether the reference-plate captured-image-data storing unit has a piece of image data on the reference plate 7 in which the normal difference is smaller than the threshold value for the entire evaluation area on the object 4. If the determination is yes, the process ends. If the determination is no, the process returns to S232, and the subsequent processes are repeated.

<Process in S2140>

In the following, the color evaluation unit 2105 evaluates the color of the surface of the object 4 based on the captured image data on the object 4, the geometric data on the object 4, and the captured image data on the reference plate 7 stored by the reference-plate captured-image-data storing unit 2104. Specifically, the color evaluation unit 2105 obtains, from the reference-plate captured-image-data storing unit 2104, the captured image data on the reference plate 7 that has a normal the angular difference between which and the normal of the face of the object 4 is smaller than the threshold value T for each of all the pixels of the object 4. Then, the color evaluation unit 2105 calculates color evaluation values based on color information at the scanned pixel positions and color information on the captured image data on the reference plate 7. The color evaluation values are calculated in a process the same as or similar to the one in S240 in the first embodiment.

As has been described above, the image-capturing control apparatus according to the present embodiment captures, for the entire area of an object, an image of the reference plate the face of which is oriented in the face orientation of each point on the object. This process enables color evaluation with geometric conditions taken into account not only for a specified position but for the entire area of an object.

Sixth Embodiment

In the first, second, third, fourth, and fifth embodiments, color evaluation of the object 4 is performed by capturing images of the object 4 and the reference plate 7 separately. Unlike those embodiments, the sixth embodiment relates to a configuration in which images of the object 4 and the reference plate 7 is captured with those placed in the same angle of view, on the assumption that lighting conditions are approximately the same around the object 4. In the following, portions of the present embodiment different from the first, second, third, fourth, and fifth embodiments are mainly described.

<Functional Configuration of Color Evaluation System>

Figure 25:
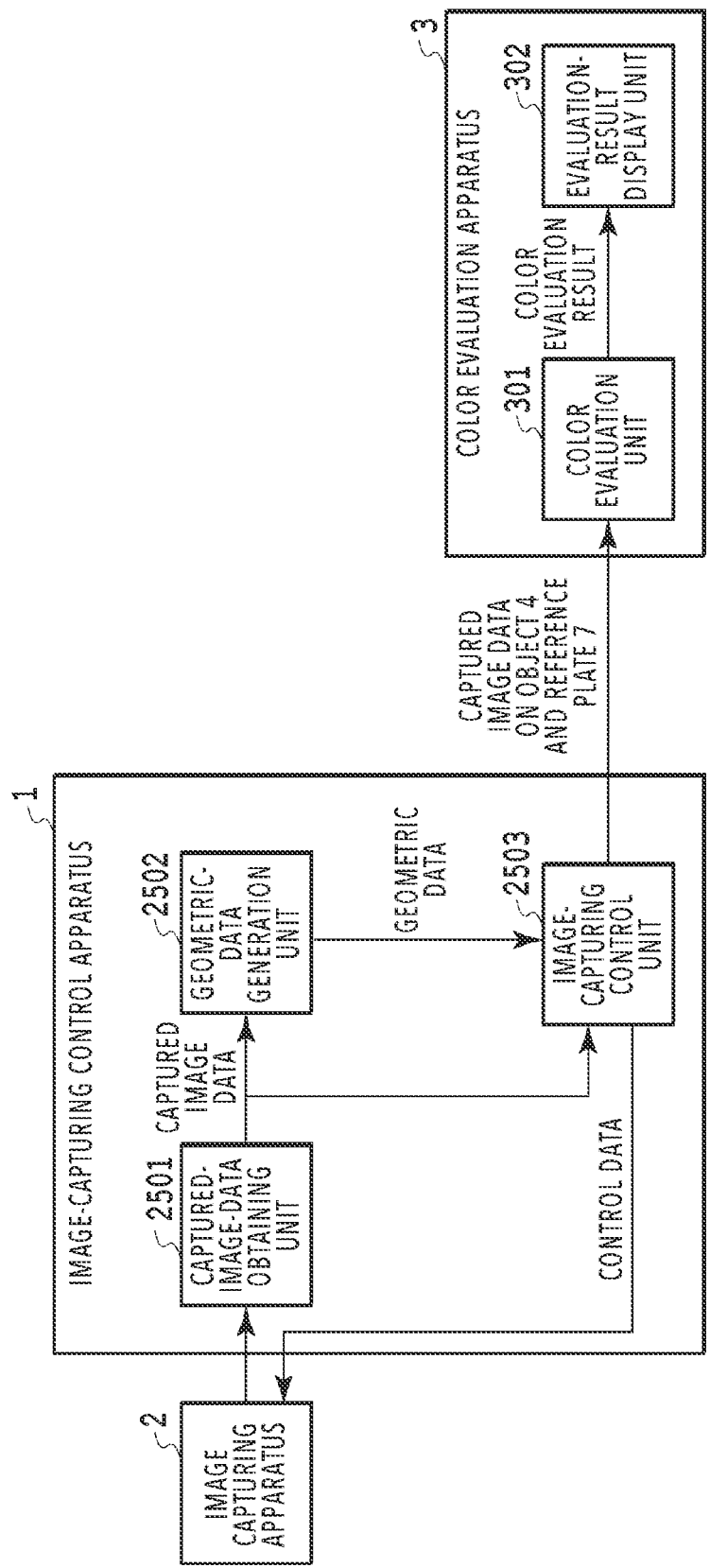
FIG. 25 is a block diagram illustrating the functional configuration of a color evaluation system.

FIG. 25 is a block diagram illustrating the functional configuration of a color evaluation system according to the sixth embodiment. The color evaluation system of the present embodiment includes an image-capturing control apparatus 1 and a color evaluation apparatus 3. The image-capturing control apparatus 1 includes a captured-image-data obtaining unit 2501, geometric-data generation unit 2502, and image-capturing control unit 2503, and the color evaluation apparatus 3 includes a color evaluation unit 301 and an evaluation-result display unit 302.

The reference plate 7 which is a reference of the color evaluation is placed near the object 4 which is the target of color evaluation, and the captured-image-data obtaining unit 2501 obtains captured image data obtained by the image capturing apparatus 2 capturing an image of the object 4 and the reference plate 7. The geometric-data generation unit 2502 calculates geometric data representing the three-dimensional shape of the object 4 based on the captured image data obtained by the captured-image-data obtaining unit 2501 capturing the image of the object 4 and the reference plate 7. The image-capturing control unit 2503 controls the image capturing apparatus 2 based on the geometric data on the object 4 and the reference plate 7 and thereby obtains captured image data on the reference plate 7 via the captured-image-data obtaining unit 201.

The color evaluation unit 301 and the evaluation-result display unit 302 are the same as or similar to those in the first embodiment, and hence description thereof is omitted.

<Process in Color Evaluation System>

Figure 26:
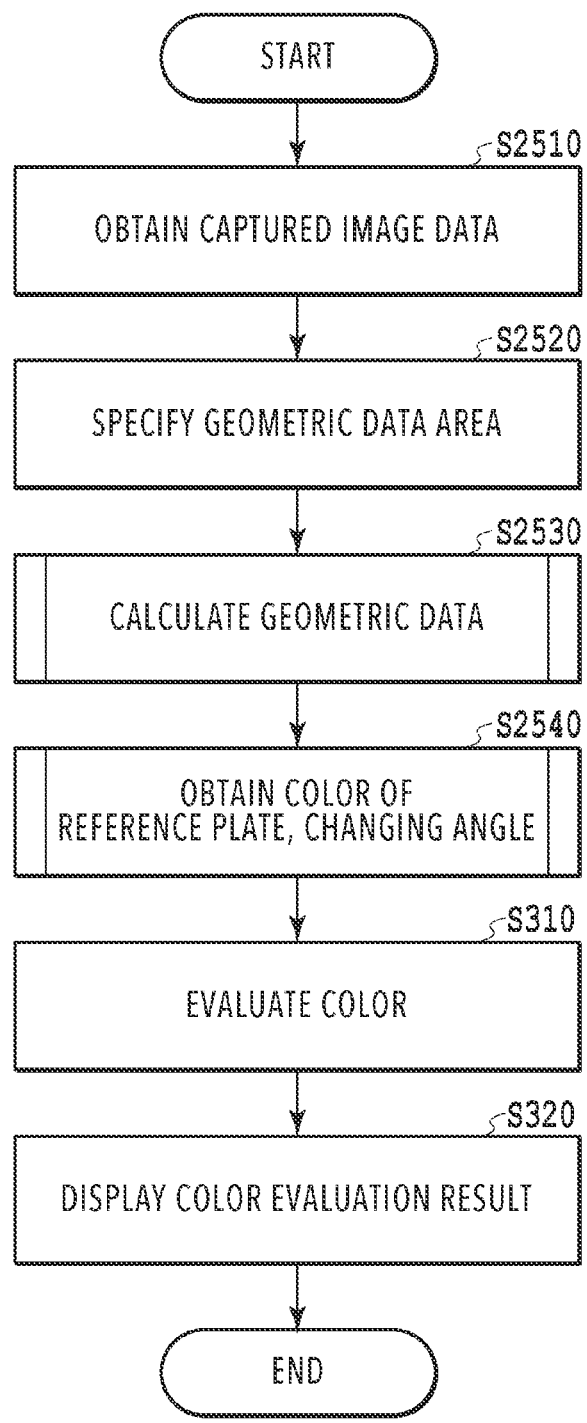
FIG. 26 is a flowchart illustrating a process in the color evaluation system.

FIG. 26 is a flowchart illustrating a process executed in the color evaluation system according to the sixth embodiment.

First, at S2510, the captured-image-data obtaining unit 2501 obtains captured image data obtained by the image capturing apparatus 2 capturing images of the object 4 and the reference plate 7 placed near the object 4 in the same angle of view. Next, at S2520, the geometric-data generation unit 2502 specifies image areas corresponding to the object 4 and the reference plate 7, respectively, in the captured image data obtained by the captured-image-data obtaining unit 2501. Details of the process in S2520 will be described later with reference to FIGS. 27 and 28. At S2530, the geometric-data generation unit 2502 generates geometric data on the object 4 based on a marker in the image area corresponding to the object 4, specified at S2520. Generation of geometric data is a process the same as or similar to the one in S220 in the first embodiment, and hence description thereof is omitted.

Next, at S2540, the image-capturing control unit 2503 controls the image capturing apparatus 2 to capture an image and obtains geometric data on the reference plate 7 generated by the geometric-data generation unit 2502 from captured image data obtained from the image capturing. Then, the image-capturing control unit 2503 controls the image capturing apparatus 2 to capture images of the reference plate 7 near the object 4 until the face orientation of the reference plate 7 agrees with the face orientation at the position on the object 4 where color evaluation is to be performed, based on the geometric data on the object 4 and the reference plate 7. Specifically, at S2520, the geometric-data generation unit 2502 calculates geometric data on the reference plate 7 based on a marker outside the specified image area of the object 4. The image-capturing control unit 2503 also captures an image using the image capturing apparatus 2 in the case where the difference between the normal of the position on the object 4 where color evaluation is to be performed and the normal of the reference plate 7 is smaller than a threshold value. The methods of calculating the geometric data and controlling the image capturing apparatus 2 are processes the same as or similar to those in S230 in the first embodiment, and hence description thereof is omitted.

The processes in S310 and S320 are the same as or similar to those in the first embodiment, and hence description thereof is omitted.

<Process in S2520. Specifying Image Area to be Used for Generating Geometric Data>

Figure 27:
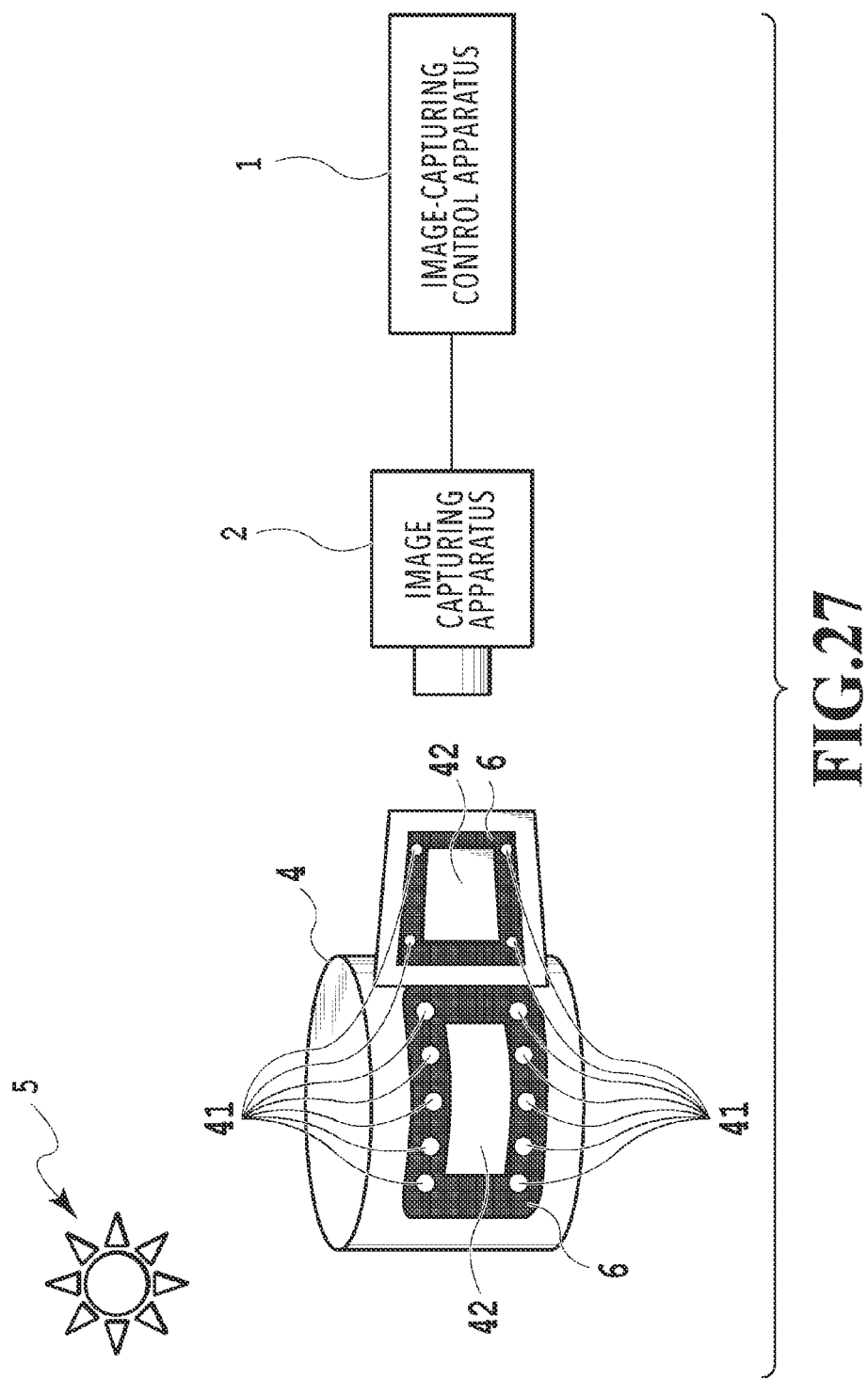
FIG. 27 is a diagram for explaining a scene in which images of an object and a reference plate are being captured in the same angle of view.
Figure 28:
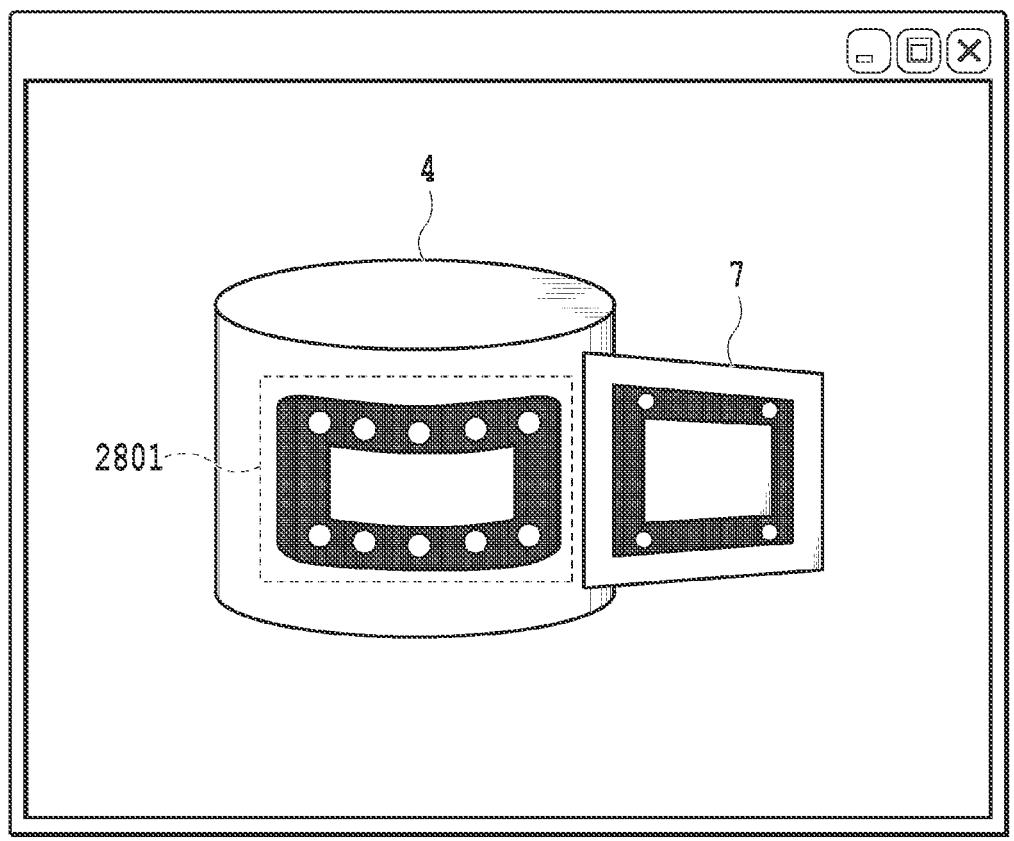
FIG. 28 is a diagram illustrating an example UI for specifying a marker area on an object.

At S2520, the geometric-data generation unit 2502 specifies an image area corresponding to the object 4 in the captured image data obtained by the captured-image-data obtaining unit 2501. FIG. 27 illustrates a scene in which an image of the object 4 and the reference plate 7, placed near the object 4, according to the sixth embodiment is being captured. The object 4 which is the target of color evaluation and the reference plate 7 are placed to be close to each other, and each of them has a marker 6 attached on it. The markers 6 each have pattern areas 41 and an evaluation area 42, and the evaluation areas 42 are used for color evaluation on the surface of the object 4. Since a captured image obtained by capturing an image in the object arrangement in FIG. 27 includes the object 4 and the reference plate 7, the area of the object 4 to be used for generating the geometric data on the object 4 needs to be specified by using the marker. FIG. 28 illustrates a UI example for specifying an image area to calculate the three-dimensional shape of the object 4, in the captured image data obtained by the captured-image-data obtaining unit 2501 at S2510. On the displayed captured image, a marker area 2801 of the object 4 is specified for the area to be used for calculating the three-dimensional shape of the object 4. Similarly, also for the reference plate 7, an area is specified on the reference plate 7 with the marker.

As has been described above, the image-capturing control apparatus 1 in the present embodiment performs color evaluation of the object 4 based on the orientation of the reference plate 7 placed near the object 4. This configuration eliminates the necessity of replacing the object 4 and the reference plate 7 in turn for every color evaluation process and enables color evaluation with a simple arrangement of just placing the reference plate 7 near the object 4 for image capturing.

[Modifications]

The foregoing embodiments have been described based on examples in which geometric data is obtained by using a captured image of at least one of the object 4 and the reference plate 7, the one having a marker attached on it. However, geometric data for both may be obtained from CAD data. For a configuration in this case, the geometric-data generation unit 202 for generating geometric data from a captured image is eliminated from the configuration illustrated in FIG. 10 or 13, and geometric data on the object 4 and the reference plate 7 is outputted from the pattern matching unit 1002.

Although the descriptions of the foregoing embodiments are based on a color evaluation system or a color evaluation apparatus with geometric conditions of the object and the reference plate taken into account, the foregoing embodiments are applicable to cases in which geometric conditions need to be matched between the object and the reference plate in appearance evaluation. For example, the color evaluation apparatus may be replaced, for example, with a texture evaluation apparatus that is used for texture evaluation or the like for comparing the texture of a compared object with that of a reference plate. Here, these evaluation apparatuses are referred to as appearance evaluation apparatuses.

Although the foregoing embodiments are based on the assumption that use of lighting in the same space is one of the image-capturing conditions for the object 4 and the reference plate 7, images of the object 4 and the reference plate 7 may be captured in different rooms having the same lighting. In that case, the object 4 and the image capturing apparatus 2 are arranged in the same condition in the respective spaces, and color matching is performed in advance between the image capturing apparatuses.

In addition, in the foregoing embodiments, the image-capturing control unit makes the image capturing apparatus 2 stop image-capturing in the case where the difference between the face orientation of the evaluation area on the object 4 and the face orientation of the reference plate becomes smaller than the threshold value. However, even if the difference between the face orientations becomes smaller than the threshold value, the image capturing apparatus 2 does not need to stop image-capturing. In that case, the display 15 may show some information to notify the user that color information on the reference object in which the difference between the face orientations is smaller than the threshold value has been obtained.

In the sixth embodiment, although the user specifies the area from which the shape of the object 4 is to be calculated, the markers for the object 4 and the reference plate 7 may have different colors or shapes to automatically distinguish the object and the reference plate 7.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

In addition, the processes by the geometric-data generation unit 202, the color evaluation unit 301, and the like out of the foregoing processing units may be replaced with processes using a trained model subjected to machine learning. In that case, for example, multiple combinations of input data for a processing unit and the output data are prepared as learning data, and a trained model is generated which has acquired learned knowledge from those multiple combinations by machine learning and is capable of outputting output data corresponding to input data, as a result of the input, based on the learned knowledge. The trained model may be, for example, a neural network model. Then, the trained model, serving as a program for performing processes equivalent to those performed by the above units, cooperates with a CPU, a GPU, or the like to perform the processes by the foregoing processing units. Note that the above trained model may be updated after a specified process as necessary.

For example, for the geometric-data generation unit 202, input is captured image data on the object 4 which is the target of color evaluation, and output is geometric data. In machine learning, the actual object shape (for example, the shape obtained from CAD data) corresponding to a distribution of normals of multiple evaluation areas in captured image data on the object 4, which is input data, can be used as training data. For the color evaluation unit 301, input is color information on the object 4 in captured image data and color information, in captured image data, on the reference plate 7 having a normal the difference between which and the normal of the object is smaller than a threshold value, and output is color evaluation result, for example, color difference. In this case, in machine learning, actually-measured color difference can be used as training data for color information on the object 4 in the captured image data and color information on the reference plate 7 in the captured image data.

The present invention enables reduction of cost necessary for appearance evaluation on a target object with image-capturing condition taken into account.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2019-221183 filed Dec. 6, 2019 and No. 2020-129853 filed Jul. 31, 2020, which are hereby incorporated by reference wherein in their entirety.

What is claimed is:

1. An image-capturing control apparatus that controls an image capturing unit configured to capture an image of a reference object serving as an evaluation reference at a predetermined time interval, to obtain color information to be used for appearance evaluation of a target object, the image-capturing control apparatus comprising:
- one or more processors; and
- one or more memories including instructions stored thereon that, when executed by the one or more processors, cause the image-capturing control apparatus to function as:
  - a first obtaining unit configured to obtain data on a face orientation of an evaluation area on the target object;
  - a control unit configured to make the image capturing unit stop capturing the image of the reference object based on the data on the face orientation;
  - a second obtaining unit configured to obtain color information on the reference object for a case where a difference between the face orientation of the evaluation area and a face orientation of the reference object is smaller than a threshold value; and
  - an output unit configured to output the color information on the reference object to an evaluation unit configured to evaluate an appearance of the target object.

2. The image-capturing control apparatus according to claim 1, wherein
based on image data obtained by capturing an image of the target object and image data obtained by capturing an image of the reference object, the first obtaining unit obtains data on the face orientations of the target object and the reference object.

3. The image-capturing control apparatus according to claim 1, wherein
the first obtaining unit obtains data on the face orientations of the target object and the reference object based on CAD (Computer Aided Design) data on the target object and CAD data on the reference object, and
the second obtaining unit obtains image data obtained by capturing an image of the target object corresponding to the data on the face orientation, based on the CAD data on the target object.

4. The image-capturing control apparatus according to claim 1, wherein
the first obtaining unit obtains data on the face orientations of the target object and the reference object based on image data obtained by capturing one of the target object and the reference object and CAD (Computer Aided Design) data on the other of the target object and the reference object, and
the second obtaining unit obtains image data obtained by capturing the other of the target object and the reference object corresponding to the data on the face orientations.

5. The image-capturing control apparatus according to claim 2, wherein the instructions, when executed by the one or more processors, further cause the image-capturing control apparatus to function as:
a specifying unit configured to specify an image area corresponding to the target object and an image area corresponding to the reference object in image data obtained by capturing images of the target object and the reference object, wherein
the first obtaining unit sets the image area corresponding to the target object as the image data obtained by capturing the image of the target object and sets the image area corresponding to the reference object as the image data obtained by capturing the image of the reference object.

6. The image-capturing control apparatus according to claim 1, wherein
the output unit outputs image data obtained by capturing an image of the target object to the evaluation unit.

7. The image-capturing control apparatus according to claim 2, wherein
the image data obtained by capturing the images of the target object and the reference object is image data obtained by capturing the images with an angle of view that includes both the target object and the reference object.

8. The image-capturing control apparatus according to claim 1, wherein
data on the face orientations of the target object and the reference object is data representing normals to the faces of the target object and the reference object.

9. The image-capturing control apparatus according to claim 1, wherein the instructions, when executed by the one or more processors, further cause the image-capturing control apparatus to function as:
a display control unit configured to compare the data on the face orientation of the target object and data on the face orientation of the reference object and display the face orientation of the reference object for a case where the difference between the face orientations is small.

10. The image-capturing control apparatus according to claim 1, wherein
the second obtaining unit compares the data on the face orientation of the target object and data on the face orientation of the reference object, and
the second obtaining unit obtains image data obtained by capturing an image of the reference object in a case where the difference between the face orientations is smaller than the threshold value.

11. A non-transitory computer-readable storage medium storing a program that causes a computer to execute an image-capturing control method of controlling an image capturing unit configured to capture an image of a reference object serving as an evaluation reference at a predetermined time interval, to obtain color information to be used for appearance evaluation of a target object, the method comprising:
obtaining data on a face orientation of an evaluation area on the target object;
making the image capturing unit stop capturing the image of the reference object based on the data on the face orientation;
obtaining color information on the reference object for a case where a difference between the face orientation of the evaluation area and a face orientation of the reference object is smaller than a threshold value; and
outputting the color information on the reference object to an evaluation unit that evaluates an appearance of the target object.

12. An image-capturing control method of controlling an image capturing unit configured to capture an image of a reference object serving as an evaluation reference at a predetermined time interval, to obtain color information to be used for appearance evaluation of a target object, the image-capturing control method comprising:
obtaining data on a face orientation of an evaluation area on the target object;
making the image capturing unit stop capturing the image of the reference object based on the data on the face orientation;
obtaining color information on the reference object for a case where a difference between the face orientation of the evaluation area and a face orientation of the reference object is smaller than a threshold value; and outputting the color information on the reference object to an evaluation unit that evaluates an appearance of the target object.

* * * * *